United States Patent
Warren

(10) Patent No.: US 10,244,181 B2
(45) Date of Patent: Mar. 26, 2019

(54) COMPACT MULTI-ZONE INFRARED LASER ILLUMINATOR

(71) Applicant: TRILUMINA CORP., Albuquerque, NM (US)

(72) Inventor: Mial E. Warren, Albuquerque, NM (US)

(73) Assignee: TRILUMINA CORP., Albuquerque, NM (US)

( * ) Notice: Subject to any disclaimer, the term of this patent is extended or adjusted under 35 U.S.C. 154(b) by 0 days.

(21) Appl. No.: 15/040,975

(22) Filed: Feb. 10, 2016

(65) Prior Publication Data

US 2016/0164261 A1 Jun. 9, 2016

Related U.S. Application Data

(60) Continuation-in-part of application No. 14/946,730, filed on Nov. 19, 2015, and a continuation-in-part of
(Continued)

(51) Int. Cl.
*H04N 5/14* (2006.01)
*H04N 5/33* (2006.01)
(Continued)

(52) U.S. Cl.
CPC ........... *H04N 5/2354* (2013.01); *H01S 5/026* (2013.01); *H01S 5/18388* (2013.01);
(Continued)

(58) Field of Classification Search
CPC . H01S 5/423; H01S 5/426; H01S 5/40; H01S 5/022; H01S 5/026; H01S 5/18388; H04N 9/04
(Continued)

(56) References Cited

U.S. PATENT DOCUMENTS 3,805,255 A 4/1974 Baker
4,127,322 A 11/1978 Jacobsen et al.
(Continued)

FOREIGN PATENT DOCUMENTS

CN 101375112 A 2/2009
DE 102008030844 A1 12/2009
(Continued)

OTHER PUBLICATIONS

Warren et al., Integration of Diffractive Lenses with Addressable Vertical-Cavity Laser Arrays, Sandia National Laboratories, Albuquerque, NM 87185, Apr. 1, 1995, Conf-950226-38, Sand 95-0360C, 11 pages.
(Continued)

*Primary Examiner* — Tuan N Nguyen
(74) *Attorney, Agent, or Firm* — Baker & Hostetler LLP

(57) ABSTRACT

Methods, devices and systems are described for selectively illuminating different zones of a field of view by a multi-zone illumination device. In one aspect, a multi-zone illuminator may include a plurality of vertical cavity surface emitting lasers (VCSELs), and a plurality of micro-optical devices aligned with apertures of individual or groups of VCSELs, which are configured to be individually activated to provide adjustable illumination to different zones of a field of view of an image sensor. In another aspect, a method of selective illumination may include receiving information specifying a field of view of a camera, and controlling at least two sub arrays or individual illuminators of an illuminating array to output light at independently adjustable illumination powers, wherein each of the at least two sub arrays are independently configurable to illuminate at least one of a plurality of separate zones corresponding to the field of view of the camera.

24 Claims, 17 Drawing Sheets

Related U.S. Application Data application No. 14/813,011, filed on Jul. 29, 2015, now Pat. No. 10,038,304, said application No. 14/946,730 is a continuation-in-part of application No. 13/902,555, filed on May 24, 2013, now Pat. No. 8,995,493, and a continuation-in-part of application No. 13/868,034, filed on Apr. 22, 2013, now Pat. No. 9,232,592, said application No. 14/946,730 is a division of application No. 13/594,714, filed on Aug. 24, 2012, said application No. 14/813,011 is a continuation-in-part of application No. 13/077,769, filed on Mar. 31, 2011, now Pat. No. 8,848,757, and a continuation of application No. 12/707,657, filed on Feb. 17, 2010, now Pat. No. 7,949,024.

(60) Provisional application No. 61/153,190, filed on Feb. 17, 2009, provisional application No. 62/030,481, filed on Jul. 29, 2014, provisional application No. 61/671,036, filed on Jul. 12, 2012, provisional application No. 61/636,570, filed on Apr. 20, 2012, provisional application No. 61/528,119, filed on Aug. 26, 2011.

(51) Int. Cl.
| | | |
|---|---|---|
| *H04N 5/235* | (2006.01) | |
| *H01S 5/026* | (2006.01) | |
| *H04N 5/225* | (2006.01) | |
| *H01S 5/183* | (2006.01) | |
| *H01S 5/42* | (2006.01) | |
| *H01S 5/00* | (2006.01) | |
| *H01S 5/022* | (2006.01) | |
| *H01S 5/024* | (2006.01) | |
| *H01S 5/042* | (2006.01) | |
| *H01S 5/062* | (2006.01) | |

(52) U.S. Cl.
CPC ........... *H01S 5/423* (2013.01); *H04N 5/2256* (2013.01); *H04N 5/332* (2013.01); *H01S 5/005* (2013.01); *H01S 5/0014* (2013.01); *H01S 5/0224* (2013.01); *H01S 5/02272* (2013.01); *H01S 5/02276* (2013.01); *H01S 5/02469* (2013.01); *H01S 5/0425* (2013.01); *H01S 5/06226* (2013.01); *H01S 5/18311* (2013.01); *H01S 5/18347* (2013.01); *H01S 2301/176* (2013.01)

(58) Field of Classification Search
USPC ............ 372/50.124, 50.122, 50.12; 348/168; 250/495.1
See application file for complete search history.

(56) References Cited

U.S. PATENT DOCUMENTS

| | | | |
|---|---|---|---|
| 4,447,136 A | 5/1984 | Kitamura | |
| 4,448,491 A | 5/1984 | Okubo | |
| 4,714,314 A | 12/1987 | Yang et al. | |
| 4,822,755 A | 4/1989 | Hawkins et al. | |
| 4,827,482 A | 5/1989 | Towe et al. | |
| 4,850,685 A | 7/1989 | Kamakura et al. | |
| 4,870,652 A | 9/1989 | Thornton | |
| 4,881,237 A | 11/1989 | Donnelly | |
| 4,971,927 A | 11/1990 | Leas | |
| 5,034,344 A | 7/1991 | Jewell et al. | |
| 5,070,399 A | 12/1991 | Martel | |
| 5,073,041 A * | 12/1991 | Rastani | H01S 5/423 372/101 |
| 5,098,183 A | 3/1992 | Sonehara | |
| 5,164,949 A | 11/1992 | Ackley et al. | |
| 5,258,316 A | 11/1993 | Ackley et al. | |
| 5,325,385 A * | 6/1994 | Kasukawa | H01S 5/227 372/45.011 |
| 5,325,386 A | 6/1994 | Jewell et al. | |
| 5,328,854 A | 7/1994 | Vakhshoori et al. | |
| 5,359,618 A | 10/1994 | Lebby et al. | |
| 5,383,200 A | 1/1995 | Barrett et al. | |
| 5,402,436 A | 3/1995 | Paoli | |
| 5,420,879 A | 5/1995 | Kawarada et al. | |
| 5,422,753 A | 6/1995 | Harris | |
| 5,422,903 A | 6/1995 | Yamada et al. | |
| 5,457,561 A | 10/1995 | Taneya et al. | |
| 5,504,767 A | 4/1996 | Jamison et al. | |
| 5,557,115 A | 9/1996 | Shakuda et al. | |
| 5,574,738 A | 11/1996 | Morgan | |
| 5,581,571 A | 12/1996 | Holonyak et al. | |
| 5,640,188 A | 6/1997 | Andrews | |
| 5,680,241 A | 10/1997 | Sakanaka | |
| 5,707,139 A | 1/1998 | Haitz | |
| 5,745,515 A | 4/1998 | Mart et al. | |
| 5,758,951 A | 6/1998 | Haitz | |
| 5,781,671 A * | 7/1998 | Li | H04B 10/803 372/50.1 |
| 5,801,666 A | 9/1998 | Macfarlane | |
| 5,812,571 A | 9/1998 | Peters et al. | |
| 5,825,803 A | 10/1998 | Labranche et al. | |
| 5,896,408 A | 4/1999 | Corzine et al. | |
| 5,918,108 A | 6/1999 | Peters | |
| 5,930,279 A | 7/1999 | Apollonov et al. | |
| 5,976,905 A | 11/1999 | Cockerill et al. | |
| 5,991,318 A | 11/1999 | Caprara et al. | |
| 6,007,218 A | 12/1999 | German et al. | |
| 6,044,101 A | 3/2000 | Luft | |
| 6,075,804 A | 6/2000 | Deppe et al. | |
| 6,125,598 A | 10/2000 | Lanphier | |
| 6,128,131 A | 10/2000 | Tang | |
| 6,136,623 A | 10/2000 | Hofstetter et al. | |
| 6,154,480 A | 11/2000 | Magnusson et al. | |
| 6,167,068 A | 12/2000 | Caprara et al. | |
| 6,215,598 B1 | 4/2001 | Hwu | |
| 6,259,715 B1 | 7/2001 | Nakayama | |
| 6,353,502 B1 | 3/2002 | Marchant et al. | |
| 6,393,038 B1 | 5/2002 | Raymond et al. | |
| 6,446,708 B1 | 9/2002 | Lai | |
| 6,493,368 B1 | 12/2002 | Chirovsky et al. | |
| 6,608,849 B2 | 8/2003 | Mawst et al. | |
| 6,661,820 B1 | 12/2003 | Camilleri et al. | |
| 6,728,289 B1 | 4/2004 | Peake et al. | |
| 6,757,314 B2 | 6/2004 | Kneissl et al. | |
| 6,775,308 B2 | 8/2004 | Hamster et al. | |
| 6,775,480 B1 | 8/2004 | Goodwill | |
| 6,898,222 B2 | 5/2005 | Hennig et al. | |
| 6,922,430 B2 | 7/2005 | Biswas et al. | |
| 6,943,875 B2 | 9/2005 | DeFelic et al. | |
| 6,947,459 B2 | 9/2005 | Kurtz et al. | |
| 6,959,025 B2 | 10/2005 | Jikutani et al. | |
| 6,974,373 B2 | 12/2005 | Kriesel | |
| 7,016,381 B2 | 3/2006 | Husain et al. | |
| 7,087,886 B2 | 8/2006 | Almi et al. | |
| 7,126,974 B1 | 10/2006 | Dong et al. | |
| 7,232,240 B2 | 6/2007 | Kosnik et al. | |
| 7,257,141 B2 | 8/2007 | Chua | |
| 7,262,758 B2 | 8/2007 | Kahen et al. | |
| 7,315,560 B2 | 1/2008 | Lewis et al. | |
| 7,357,513 B2 | 4/2008 | Watson et al. | |
| 7,359,420 B2 | 4/2008 | Shchegrov et al. | |
| 7,385,229 B2 | 6/2008 | Venugopalan | |
| 7,386,025 B2 | 6/2008 | Omori et al. | |
| 7,388,893 B2 | 6/2008 | Watanabe et al. | |
| 7,430,231 B2 | 9/2008 | Luo et al. | |
| 7,471,854 B2 | 12/2008 | Cho et al. | |
| 7,568,802 B2 | 8/2009 | Phinney et al. | |
| 7,613,215 B2 | 11/2009 | Kim | |
| 7,680,168 B2 | 3/2010 | Uchida | |
| 7,688,525 B2 | 3/2010 | Hines et al. | |
| 7,742,640 B1 | 6/2010 | Carlson et al. | |
| 7,751,716 B2 | 7/2010 | Killinger | |
| 7,787,767 B2 | 8/2010 | Wang | |
| 7,796,081 B2 | 9/2010 | Breed | |

(56) References Cited

U.S. PATENT DOCUMENTS

| | | |
|---|---|---|
| 7,834,302 B2 | 11/2010 | Ripingill et al. |
| 7,911,412 B2 | 3/2011 | Benner |
| 7,925,059 B2 | 4/2011 | Hoyos et al. |
| 7,949,024 B2 | 5/2011 | Joseph |
| 7,970,279 B2 | 6/2011 | Dress |
| 8,396,370 B2 | 3/2013 | Mu |
| 8,995,485 B2* | 3/2015 | Joseph ................. H01S 5/02438 372/36 |
| 8,995,493 B2* | 3/2015 | Joseph ................... H01S 5/183 372/50.12 |
| 2001/0040714 A1 | 11/2001 | Sundaram et al. |
| 2001/0043381 A1 | 11/2001 | Green et al. |
| 2002/0034014 A1 | 3/2002 | Gretton et al. |
| 2002/0041562 A1 | 4/2002 | Redmond et al. |
| 2002/0129723 A1* | 9/2002 | Beier ....................... B41J 2/451 101/463.1 |
| 2002/0141902 A1 | 10/2002 | Ozasa et al. |
| 2003/0035451 A1 | 2/2003 | Ishida et al. |
| 2003/0091084 A1 | 5/2003 | Sun et al. |
| 2003/0095800 A1* | 5/2003 | Finizio ................... G03B 17/00 396/427 |
| 2003/0215194 A1 | 11/2003 | Kuhmann et al. |
| 2004/0120717 A1 | 6/2004 | Clark et al. |
| 2004/0207926 A1 | 10/2004 | Buckman et al. |
| 2004/0208596 A1 | 10/2004 | Bringans et al. |
| 2005/0019973 A1 | 1/2005 | Chua |
| 2005/0025210 A1 | 2/2005 | Aoyagi et al. |
| 2005/0025211 A1* | 2/2005 | Zhang ..................... H01S 5/423 372/101 |
| 2005/0122720 A1 | 6/2005 | Shimonaka et al. |
| 2005/0147135 A1 | 7/2005 | Kurtz et al. |
| 2006/0109883 A1 | 5/2006 | Lewis et al. |
| 2006/0268241 A1 | 11/2006 | Watson et al. |
| 2006/0274918 A1 | 12/2006 | Amantea et al. |
| 2006/0280219 A1 | 12/2006 | Shchegrov et al. |
| 2007/0052660 A1 | 3/2007 | Montbach et al. |
| 2007/0099395 A1 | 5/2007 | Sridhar et al. |
| 2007/0153862 A1 | 7/2007 | Shchegrov et al. |
| 2007/0153866 A1 | 7/2007 | Shchegrov et al. |
| 2007/0242958 A1 | 10/2007 | Ieda |
| 2007/0273957 A1 | 11/2007 | Zalevsky et al. |
| 2008/0008471 A1 | 1/2008 | Dress |
| 2008/0205462 A1 | 8/2008 | Uchida |
| 2008/0273830 A1 | 11/2008 | Chen et al. |
| 2008/0317406 A1 | 12/2008 | Santori et al. |
| 2009/0027778 A1 | 1/2009 | Wu et al. |
| 2009/0141242 A1 | 6/2009 | Silverstein et al. |
| 2009/0245312 A1 | 10/2009 | Kageyama et al. |
| 2009/0278960 A1* | 11/2009 | Silverbrook ......... B41J 2/17503 348/240.2 |
| 2009/0284713 A1 | 11/2009 | Silverstein et al. |
| 2010/0066889 A1* | 3/2010 | Ueda ....................... G02B 7/102 348/333.01 |
| 2010/0129083 A1 | 5/2010 | Mu |
| 2010/0129946 A1 | 5/2010 | Uchida |
| 2010/0265975 A1 | 10/2010 | Baier et al. |
| 2011/0002355 A1 | 1/2011 | Jansen |
| 2011/0148328 A1* | 6/2011 | Joseph ..................... F21K 9/00 315/312 |
| 2011/0164880 A1 | 7/2011 | Davidson et al. |
| 2011/0176567 A1 | 7/2011 | Joseph |
| 2012/0120976 A1 | 5/2012 | Budd et al. |
| 2012/0169669 A1* | 7/2012 | Lee ....................... H04N 5/2254 345/175 |
| 2012/0232536 A1 | 9/2012 | Liu et al. |
| 2012/0281293 A1* | 11/2012 | Gronenborn ....... B23K 26/0608 359/619 |
| 2013/0076960 A1 | 3/2013 | Bublitz et al. |
| 2013/0278151 A1 | 10/2013 | Lear |

FOREIGN PATENT DOCUMENTS

| | | |
|---|---|---|
| EP | 1317038 A2 | 6/2003 |
| EP | 1411653 A2 | 4/2004 |
| EP | 1024399 B1 | 12/2005 |
| EP | 1871021 A2 | 12/2007 |
| JP | 04-062801 A | 2/1992 |
| JP | 05-092618 A | 4/1993 |
| JP | H05-308327 A | 11/1993 |
| JP | 06-020051 A | 3/1994 |
| JP | 07-506220 A | 7/1995 |
| JP | H08-213954 A | 8/1996 |
| JP | H08-237204 A | 9/1996 |
| JP | H09-139963 A | 5/1997 |
| JP | H11-017615 A | 1/1999 |
| JP | 2001-246776 A | 9/2001 |
| JP | 2002-002015 A | 1/2002 |
| JP | 2005-102171 A | 4/2005 |
| JP | 2006-032885 A | 2/2006 |
| JP | 2006-067542 A | 3/2006 |
| JP | 2006-109268 A | 4/2006 |
| JP | 2006-310913 A | 11/2006 |
| JP | 2008-118542 A | 5/2008 |
| JP | 2008-277615 A | 11/2008 |
| JP | 2010-522493 A | 7/2010 |
| JP | 2010-531111 A | 9/2010 |
| JP | 2012-089564 A | 5/2012 |
| WO | WO 1993/021673 A1 | 10/1993 |
| WO | WO 2000/016503 A1 | 3/2000 |
| WO | WO 2002/010804 A1 | 2/2002 |
| WO | WO 2003/003424 A1 | 1/2003 |
| WO | WO 2005/057267 A2 | 6/2005 |
| WO | WO 2006/082893 A1 | 6/2008 |
| WO | WO 2008/115034 A1 | 9/2008 |
| WO | WO 2011/021140 A2 | 2/2011 |
| WO | WO 2012/106678 A1 | 8/2012 |

OTHER PUBLICATIONS

Gadallah, "Investigations into Matrix-Addressable VCSEL Arrays", Annual Report 2008, Institute of Optoelectronics, Ulm University, 6 pages.

International Patent Application No. PCT/US2013/42767; Int'l Preliminary Report on Patentability; dated May 6, 2015; 33 pages.

Overton; High-Power VCESLs Rule IR Illumination; Laser Focus World; Aug. 2013; 2 pages.

European Patent Application No. 13882974.2; Extended Search Report; dated Oct. 5, 2016; 9 pages.

European Patent Application No. 18183404.5; Extended Search Report; dated Aug. 16, 2018; 7 pages.

\* cited by examiner

COMPACT MULTI-ZONE INFRARED LASER ILLUMINATOR

CROSS REFERENCE TO RELATED APPLICATIONS

This application is a continuation-in-part application taking priority from U.S. patent application Ser. No. 14/813,011, filed Jul. 29, 2015, which claims benefit under 35 U.S.C. § 119(e) of Provisional U.S. Patent Application No. 62/030,481, filed Jul. 29, 2014, entitled "Laser Arrays For Variable Optical Properties," and is also a continuation-in-part application taking priority from U.S. patent application Ser. No. 13/902,555, filed May 24, 2013, now U.S. Pat. No. 8,995,493, issued Mar. 31, 2015, entitled "Microlenses for Multibeam Arrays of Optoelectronic Devices for High Frequency Operation,", and is also a continuation-in-part application taking priority from U.S. patent application Ser. No. 13/868,034 filed Apr. 22, 2013, now U.S. Pat. No. 9,232,592, issued Jan. 5, 2016, entitled "Addressable Illuminator with Eye-Safety Circuitry", which claims benefit under 35 U.S.C. § 119(e) of Provisional U.S. Patent Application No. 61/636,570, filed Apr. 20, 2012, entitled "Addressable Illuminator with Eye-Safety Circuitry". The U.S. patent application Ser. No. 14/813,011 is also a continuation-in-part application taking priority from U.S. patent application Ser. No. 13/077,769, filed Mar. 31, 2011, now U.S. Pat. No. 8,848,757, issued Sep. 30, 2014, entitled "Multibeam Arrays of Optoelectronic Devices for High Frequency Operation," which is a continuation application taking priority from U.S. patent application Ser. No. 12/707,657, filed Feb. 17, 2010, now U.S. Pat. No. 7,949,024, issued May 24, 2011, entitled "Multibeam Arrays of Optoelectronic Devices for High Frequency Operation," which takes priority from Provisional U.S. Patent Application No. 61/153,190, filed Feb. 17, 2009, entitled "Multibeam Arrays of Optoelectronic Devices for High Frequency Operation." Each of these applications is hereby incorporated by reference in its entirety.

This application is also a continuation-in-part of U.S. patent application Ser. No. 14/946,730, filed Nov. 19, 2015, which is a divisional of U.S. patent application Ser. No. 13/594,714, filed Aug. 24, 2012, which claims benefit under 35 U.S.C. § 119(e) of Provisional Application No. 61/528,119, filed Aug. 26, 2011, and of Provisional Application No. 61/671,036, filed Jul. 12, 2012, each of which are incorporated herein by reference in their entirety.

TECHNICAL FIELD

Optic systems and, more particularly, compact near infrared illumination systems and methods that enable control of the illumination intensity in separately defined zones across the field of view of an electronic imaging system.

BACKGROUND

Near infrared (NIR) illumination is increasingly popular for enhancing the performance and utility of imaging sensors in automotive, mobile and consumer applications. The image sensors are used for object detection, driver monitoring, gesture recognition and other similar user interface functions, with significant use of computational image processing. In addition to adding low light and nighttime capabilities, the illumination can be used to highlight regions of interest and enable filtering out the ambient lighted background for the benefit of image processing algorithms. A major complication for these image processing applications is the modest dynamic range of current electronic image sensors. Subjects or areas of interest captured by the electronic image sensors are often too bright, saturating the detector so that detail is not visible. In other cases, subjects or areas of interest may be too dark, also limiting useful image detail, unless the gain or shutter duration for the imaging system is adjusted so that the brightly illuminated or highly reflective regions are again saturated.

Most current NIR illumination systems are based on light-emitting diodes or LEDs. LEDs have the advantage of low cost and freedom from speckle or coherence noise, which can seriously complicate image processing. The disadvantages of LEDs in this role include the very broad emission profile that is difficult to concentrate to a smaller field and limited optical conversion efficiency at higher powers. See Overton, G. "High-power VCSELs rule IR illumination," Laser Focus World, Aug., 29-30, (2013). LEDs also have a very broad spectral output, which complicates filtering out solar background and means that some of the light can be visible to the subjects being illuminated, which can be distracting. Conventional laser diode sources can be used for illumination with narrow spectral emission, well defined beams and higher efficiency. However, a single laser source with sufficient power for illuminating the image field will have significant "speckle" or coherence noise from mutual interference of the beam with its own scattered light. In addition, the point source characteristics of single laser sources result in low eye-safe exposure levels.

SUMMARY

Devices, systems and methods are described herein for separately controlling illumination levels of multiple illumination sources directed at different regions or zones of an area or volume, such as a field of view of a camera, to provide adjustable illumination or light to the separate zones. In some aspects, the illumination sources, and the amount of light they produce, may be driven by software that receives inputs from one or more image sensors, such as one or more cameras, to enable a variety of additional or enhanced functions of the image sensor(s). These functions may include enhanced object tracking, driver monitoring, gesture recognition and other similar user interface functions that may be enhanced by specific lighting characteristics in one or more zones or subdivisions of the field of view of the image sensor.

In some instances, the illumination sources may include near infrared (NIR) illumination sources, such as a laser array. In one example, the multiple illumination sources may include vertical-cavity surface-emitting laser (VCSEL) arrays that use integrated micro-lenses for beam shaping. Such VCSELs can provide a much more usable emission profile and even provide separate, narrow illumination beams for independently addressable control of the illumination field. The combination of many low-power incoherent emitters greatly reduces coherence noise compared to conventional laser diodes and acts as an extended source with higher eye-safe intensities.

VCSEL arrays can be designed to operate at different wavelengths, thus making them particularly useful for a wide variety of applications. The most common sensors that would be used with this type of illuminator are silicon complimentary metal-oxide semiconductor (CMOS) or charge-coupled device (CCD) image sensors. Responsivity in the NIR falls off rapidly in CMOS sensors due to the thin photoabsorption layers that are compatible with the CMOS process. Wavelengths in the range of 830 nm to 940 nm are most compatible with these silicon sensors. VCSELs additionally can be fabricated at longer infrared wavelengths for applications where longer wavelength sensors may be desired.

In one aspect, multiple flip-chip bonded VCSEL devices, for example in an array and/or organized into sub arrays, may be placed on one or more sub-mounts. This design may provide greater flexibility in configuring these devices for a wide range of applications and interconnection options. The ability to interconnect separate groups of lasers in the array can be combined with the integrated micro-lenses to produce a "smart illumination" system that not only provides an optimum illumination pattern over a given area or volume, but can be actively controlled to "track" an area or object of interest to the imaging system, based on feedback from that system. The overall illumination pattern is defined by subdividing the laser array into a number of subarrays that each have one or a combination of micro-lenses with offsets calculated to provide spatially separated (but, in some cases, overlapping) illumination fields from the emitters in the subarray. A single field will typically be a limited part of the overall illumination pattern. Each subarray may be independently addressable through the sub-mount so that it can be switched on and off, and the intensity controlled by the system processor. Each subarray may illuminate a part of the overall field of view of the imaging system. Multiple subarrays can be combined to illuminate larger parts of the system field of view, including turning on all of them when required or for initial identification of the area of interest from within a large field of view. In some aspects, individual VCSEL devices may comprise a subarray, such that individual VCSELs are addressable and configurable.

Illuminating arrays can be designed to produce illumination zones covering arbitrary areas of different shapes or aspect ratios. In most cases, the illumination area would be a rectangular field with the 4:3 and 16:9 aspect ratios commonly used by commercial imaging sensors. Different numbers of illumination zones can be configured, limited by the die size and complexity that is cost-effective for the application. With these designs, all the beam shaping can be accomplished with the micro-lenses, such that there is no need for an external lens to cover fields of view of up to 50 degrees. Larger fields of view can be addressed by larger offsets of the micro-lenses that illuminate the edge of the field of view; however, total internal reflection and off-axis aberrations will cause some loss of illumination power. Larger fields of view can be addressed more efficiently by addition of an external optic to increase the angular spread provided by the micro-lenses. In some cases, a holographic diffuser can be added for additional smoothing of the beam profile and for eye safety benefits.

In some aspects, the eye-safe tolerance for the illumination array can be increased (e.g., enabling higher power illumination without exceeding eye safety regulations) by not locating the sub arrays that illuminate adjacent zones in the field of view next to each other on the laser array die, or sub mount in cases where multiple die are used to realize the illuminator.

Some aspects may utilize a "smart illuminator," where sub arrays can be controlled via software that incorporates the image processing needed for the sensor application. The software can detect areas of over illumination (resulting in saturation of the imaging sensor) and under illumination (resulting in little signal in the imaging sensor) and adjust the individual zones in the sensor field of view to provide a more uniform signal level across the whole image. This will improve the image processing software performance and allow for enhanced features for various applications.

BRIEF DESCRIPTION OF THE DRAWINGS

The drawings are provided to illustrate example embodiments described herein and are not intended to limit the scope of the disclosure.

DETAILED DESCRIPTION OF ILLUSTRATIVE EMBODIMENTS

Devices, systems and methods are described herein for separately controlling illumination levels of multiple illumination sources directed at different regions or zones of an area or volume, such as a field of view of a camera, to provide adjustable illumination to the separate zones. A multi-zone illuminator, as described herein, may enable a variety of additional or enhanced functions of the image sensor(s) or cameras, such as object tracking, driver monitoring, gesture recognition, etc., that may be enhanced by specific lighting characteristics in one or more zones or subdivisions of the field of view of the image sensor.

In some instances, the multi-zone illuminator, also referred to herein as one or more illumination sources or arrays, may include near infrared (NIR) illumination sources, such as a laser array including multiple laser devices. In one example, the multiple illumination sources may include vertical-cavity surface-emitting laser (VCSEL) arrays that use integrated micro-lenses for beam shaping. Such VCSELs can provide a usable emission profile and even provide separate, narrow illumination beams for independently addressable control of the illumination field. The combination of many low-power incoherent emitters greatly reduces coherence noise compared to conventional laser diodes and acts as an extended source with higher eye-safe intensities.

Figure 1A:
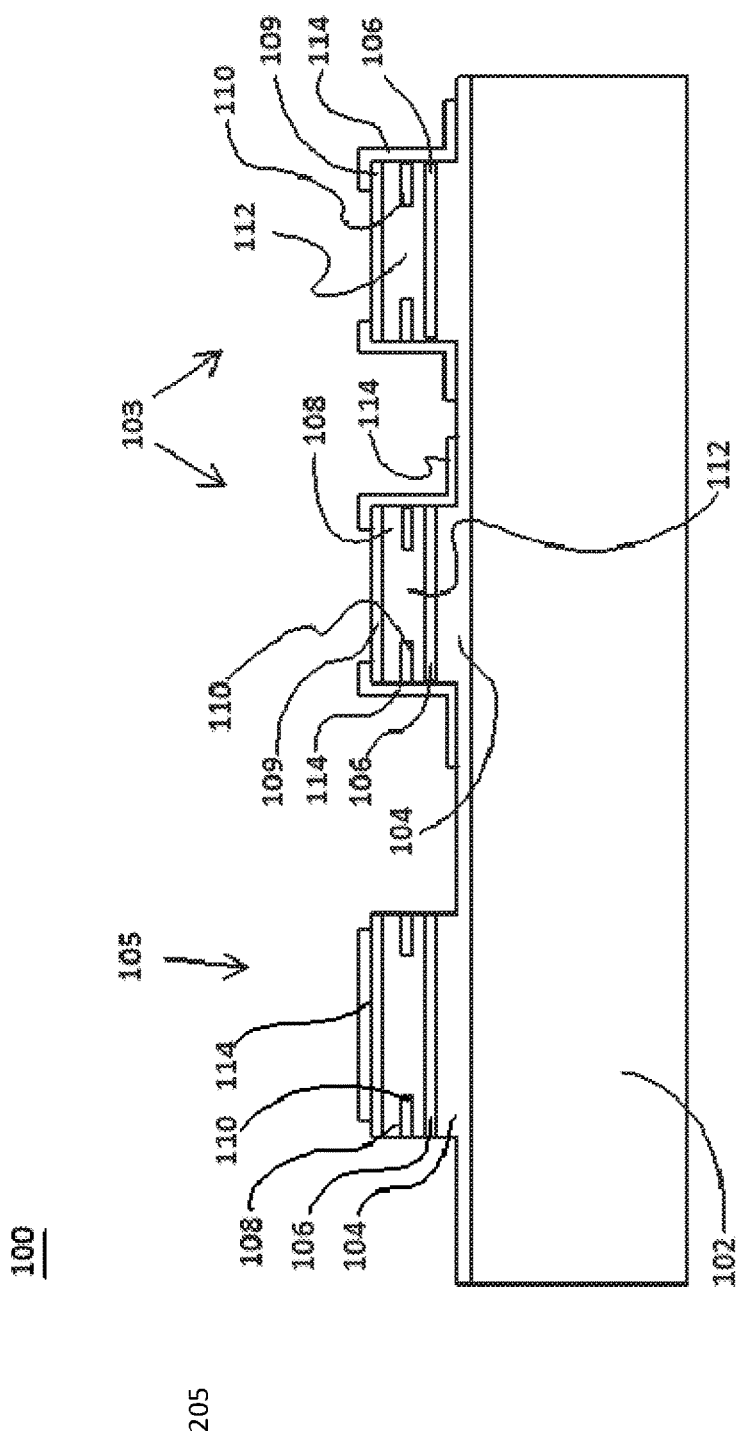
FIG. 1A is a simplified cross-sectional view illustrating the mesa structures of both the VCSEL devices and the shorting mesa devices, including dielectric deposition, metal deposition, and oxidation structures, among others features in accordance with an embodiment.

FIG. 1A shows a simplified schematic cross-section of VCSEL array device 100 in accordance with an embodiment. It will be understood that the illustration of the VCSEL array device in the embodiment shows a semiconductor device array and a method of fabricating and bonding the semiconductor device array. It will be understood, however, that the method disclosed therein can be used to fabricate arrays of other semiconductor devices, such as light emitting diodes, photodetectors, edge-emitting lasers, modulators, high electron mobility transistors, resonant tunneling diodes, heterojunction bipolar transistors, quantum dot lasers and the like. Further, it will be understood that the illustration of VCSEL array device 100 in the embodiment is for illustrative purposes only and is in no way meant to limit the scope of the invention.

In the embodiment, VCSEL array device 100 includes a substrate 102 which includes Gallium Arsenide (GaAs), although other materials such as Indium Phosphide (InP), Indium Arsenide (InAs), Silicon (Si), an epitaxially grown material, and the like, could be used to form the substrate 102. It will also be understood that substrate 102 typically includes a lattice constant chosen to minimize defects in a material layer subsequently grown thereon. It will also be understood that the choice of at least one of the compositions and the thicknesses of the subsequently grown material layers will provide a desired wavelength of operation. Subsequent layers are deposited on the substrate 102 via epitaxial growth using Molecular Beam Epitaxy (MBE), Metal-Organo-Chemical Vapor Deposition (MOCVD), and the like.

In the embodiment, a lattice-matched lower Distributed Bragg Reflector (DBR) 104 is epitaxily deposited on substrate 102 to form the first of the raised layers of the VCSEL mesas 103 and the short-circuiting/shorting/grounding mesa 105. The lower DBR 104 is formed from multiple layers of alternating materials with varying (a high and a low) indexes of refraction, or by periodic variation of some characteristic, such as height, of a dielectric waveguide, resulting in periodic variation in the effective refractive index in the guide. Each layer boundary causes a partial reflection of an optical wave, with the resulting combination of layers acting as a high-quality reflector at a desired wavelength of operation. Thus, while the lower DBR 104 (and upper DBR 108, as further described below) includes more than one material layer, it is illustrated in FIG. 1 as being comprised of a single layer for simplicity and ease of discussion herein. A portion of lower DBR 104 can also be made conductive to allow an electrical contact (not shown) to be made to the VCSEL array device.

In the embodiment, an active region 106 is epitaxily deposited on lower DBR 104. Although shown as a single layer (again for simplicity and ease of discussion), active region 106 comprises cladding (and/or waveguiding) layers, barrier layers, and an active material capable of emitting a substantial amount of light at a desired wavelength of operation. In the embodiment, the wavelength of operation is a wavelength within a range approximately given from about 620 nm to about 1600 nm (for a GaAs substrate). However, it will be understood that other wavelength ranges may be desired and will depend on the application.

As is understood by those skilled in the art, the wavelength of emission is substantially determined according to the choice of materials used to create lower DBR 104 and upper DBR 108, as well as the composition of the active region 106. Further, it will be understood that active region 106 can include various light emitting structures, such as quantum dots, quantum wells, or the like. In the embodiment, upper DBR 108 is positioned on active region 106, and like lower DBR 104, is electrically conductive to allow ohmic electrical connections to be formed (not shown). In some embodiments, lower DBR 104 is n-doped and upper DBR 108 is p-doped, but this can be reversed, where lower DBR 104 is p-doped and upper DBR 108 is n-doped. In other embodiments, electrically insulating DBRs can be employed (not shown), which utilize intra-cavity contacts and layers closer to the active region.

In some embodiments, an upper mirror contacting layer 109 is positioned on upper DBR 108. Contacting layer 109 is typically heavily doped so as to facilitate ohmic electrical connection to a metal deposited on contacting layer 109, and hence to an electrical circuit (not shown). In some embodiments, contacting layer 109 can be formed as part of upper DBR 108.

Lithography and etching can be used to define each of the mesas 103 and 105 and their structures stated above. This can be achieved by patterning the epitaxially-grown layers through a common photolithography step, such as coating, exposing, and developing a positive thick resist. The thickness of the resist can be varied as is known in the art, depending on etch-selectivity between the resist and the epitaxial layers, and the desired mesa geometry.

For GaAs-based materials, etching is usually accomplished using a Chlorine (Cl) based dry etch plasma, such as $Cl_2:BCl_3$, but any number of gases or mixtures thereof could be used. Etching can also be accomplished by many wet etchants. Other forms of etching, such as ion milling or reactive ion beam etching and the like can also be used. The depth of the etch is chosen to be deep enough to isolate the active regions of mesas in the array. The etch stops either on the N mirror (lower DBR 104), an etch stop/contact layer formed in the N mirror (lower DBR 104), or through the N mirror (lower DBR 104) into the substrate 102. After etching to form the mesas, the remaining photoresist is removed. This can be achieved using a wet solvent clean or dry Oxygen ($O_2$) etching or a combination of both.

A confinement region 110 can also be formed within each of the mesas. Within the VCSEL mesas 103, the confinement region 110 defines an aperture 112 for the device. The confinement region 110 can be formed as an index guide region, a current guide region, and the like, and provides optical and/or carrier confinement to aperture 112. Confinement regions 110 can be formed by oxidation, ion implantation and etching. For example, an oxidation of a high Aluminum (Al) content layer (or layers) can be achieved by timing the placement of the wafer or sample in an environment of heated Nitrogen ($N_2$) bubbled through Water ($H_2O$) and injected into a furnace generally over 400° C. A photolithographic step to define an ion implant area for current confinement, and combinations of these techniques and others known in the art, can also be used.

It will be understood that confinement region 110, defining aperture 112, can include more than one material layer, but is illustrated in the embodiment as including one layer for simplicity and ease of discussion. It will also be understood that more than one confinement region can be used.

In the embodiments shown in the Figures, the mesa size, and apertures of the light producing VCSELs are the same and have uniform spacing. However, in some embodiments, the individual VCSEL mesa size for the devices in an array can differ. Furthermore, the VCSEL mesa spacing in the array can differ. In some embodiments, the separation of the light producing VCSELs mesas in an array 100 is between approximately 20 µm and 200 µm. However, larger and smaller separations are also possible.

Dielectric deposition can be used and processed to define an opening for a contact surface. First, the deposition of a dielectric material 114 over the entire surface of the device 100 is usually accomplished by Plasma Enhanced Chemical Vapor Deposition (PECVD), but other techniques, such as Atomic Layer Deposition (ALD), can be used. In the embodiment, the dielectric coating 114 is a conformal coating over the upper surface (including the mesa sidewalls) and is sufficiently thick so as to prevent current leakage through pinholes from subsequent metal layers.

Other properties to consider while choosing the thickness of this film is the capacitance created between the plated metal heat sink 124 (further described below with reference to FIG. 2) and the substrate 102 ground, where the dielectric layer 114 would be more beneficial to be thicker, and the need for the dielectric layer 114 on the sidewalls of the VCSEL 103 to transfer heat from the active region to the heat sink 124, where a thinner layer would be beneficial. In some embodiments, multiple depositions using different deposition techniques can be used to accomplish a layer with both of these properties. An example of this technique is to follow a deposition of PECVD Silicon Nitride ($Si_3N_4$) with an E-beam deposition of $Si_3N_4$, or another dielectric could be deposited that has a more directional deposition rate, thereby putting thicker dielectric material on the incident surfaces. Once the dielectric layer 114 has been formed, a photolithographic process is then used to define openings in the dielectric over each of the VCSELs mesas where contact is to be made to the top mirror contact layer 109. The dielectric layer 114 is also removed over the substrate 102 between each of the VCSEL mesas 103, over the substrate 102 surrounding the ground mesa 105, and over the top and side of each ground mesa 105.

Figure 1B:
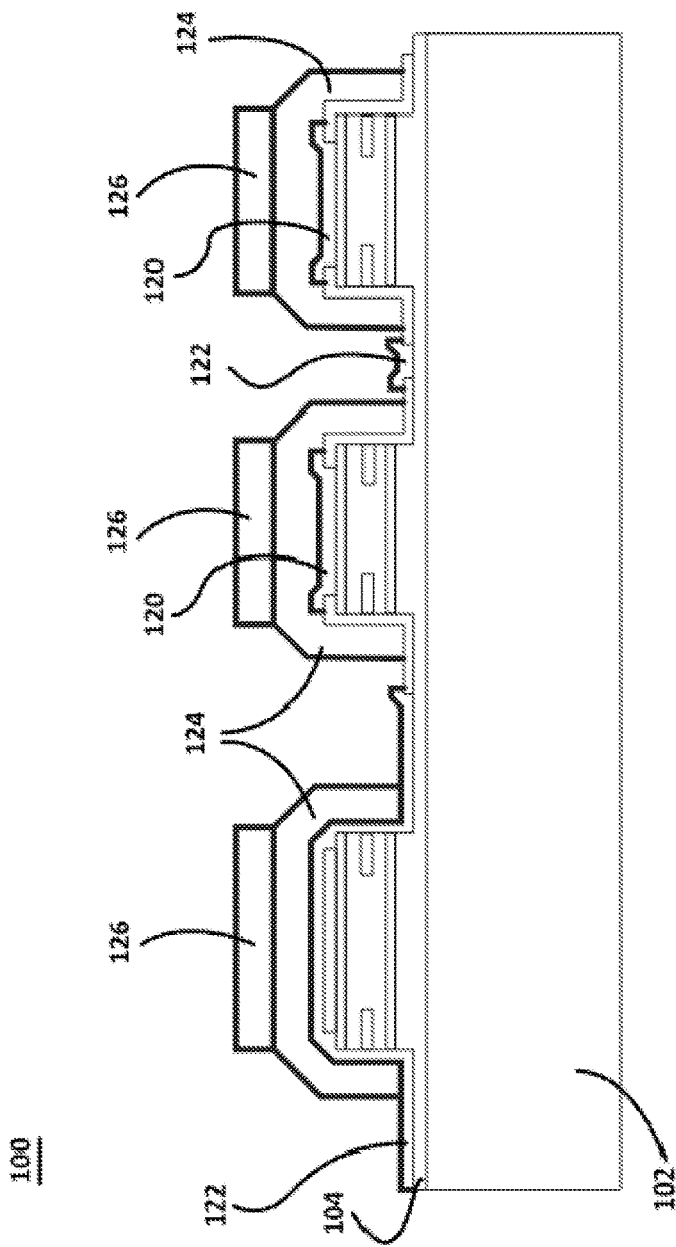
FIG. 1B is another simplified cross-sectional view of the VCSEL devices and the shorting mesa devices, further illustrating heat sinks, bonding layers, and other features in accordance with an embodiment.

Turning now to FIG. 1B, the next processing step is a photolithographic process that is used to define the contacts over the top mirrors 108, where the dielectric was opened in the above step, so that a p-metal layer can be formed therein in a subsequent step. In the embodiment, the opened area in the photoresist is slightly larger than the opening in the dielectric, typically of the order of a few µm wider. In other embodiments, its diameter can be smaller than the diameter of the dielectric opening, or as large as the diameter of the heat sink material over the shorted mesas, which is plated at a later step. This opening could not be any larger than the mesa diameter in an active light producing mesa or the subsequent metals would short out the p- and n-potentials, unless the dielectric coating is conformal and covering the N mirror portion at the mesa base.

Once the opened areas in the photoresist are defined, metallization can be performed, typically with a p-type metal, over the opened areas. The p-metal contact layer 120 is usually a multilayer deposition that is deposited by E-beam, resistive evaporation, sputter, or any other metal deposition techniques. A thin Titanium (Ti) layer is first deposited for adhesion of the next layer. The thickness of this adhesion layer can vary greatly, but is generally chosen to be between about 50 Å and about 400 Å as the Ti films are stressful and more resistive than the subsequent layers. In an embodiment, the adhesion layer is approximately 200 Å thick. Other adhesive metal layers can be substituted for this layer such as Chromium (Cr), Palladium (Pd), Nickel (Ni), and the like. Also this layer can serve as a reflector layer to increase reflectance of the contacting mirror.

The next layer is deposited directly on top of the adhesion layer without breaking vacuum during the deposition. In many cases this layer acts as a guard against the Gold (Au) or other top metals from diffusing too far into the contact (a diffusion barrier) because of excessive heating at the bonding stage. Metals chosen are generally Pd, Platinum (Pt), Ni, Tungsten (W), or other metals or combinations of these metals chosen for this purpose. The thickness chosen should depend upon specific bonding temperatures needed in the flip chip process. The thickness of this layer is typically between about 1,000 Å and about 10,000 Å. In embodiments where a low temperature bonding process is used, for example, in an Indium bonding process, a diffusion barrier layer can be optional, and not deposited as part of the metal contact stack.

The next layer is generally Au but can be Pd or Pt or mixtures such as Gold Beryllium (AuBe) or Gold Zinc (AuZn). In the embodiment described below, the thickness of this layer is approximately 2,000 Å. However, it can generally have a wide range of thicknesses depending on the photo resist properties and heating characteristics of the deposition. In some embodiments, another metal can also be deposited at this time to increase metal thickness and to form the metal heat sink at this stage, thereby reducing the number of processing steps, but this technique is not necessary and was not utilized in the demonstration devices described below.

Generally a common liftoff technique is chosen for this photolithographic process so that the metal deposited on the surface can easily be separated from the areas of the surface covered with photoresist, such that any metal on the photoresist is removed without sticking to or affecting the adhesion of the metal to the semiconductor. As noted above, a photolithographic process is then used to define the openings over various portions of the substrate 102 and the shorted n-contact mesas 105, where the dielectric was opened in a previous step. In an embodiment, the opened area in the photoresist corresponding to the n-metal deposition should be slightly larger than the opening in the dielectric openings for the n-metal. N-metal layer 122 is then deposited and can form an electrical circuit with the substrate 102 either through the lower DBR 104 (if an n-mirror), an etch stop and contact layer which is generally heavily doped within lower DBR 104, or to substrate 102 itself. The process to form the n-metal layer 122 is similar to that for the p-metal layer 120. The metal layers can be chosen to include the combinations of Ni/Ge/Au, Ge/Au/Ni/Au, or many such combinations. In some embodiments, the first layer or layers are chosen to reduce contact resistance by diffusion into the n-doped epitaxial material of the substrate 102. In other embodiments, the first layer of the multi-layer metal stack can also be chosen as a diffusion-limiting layer such as Ni so that in the annealing process the metals do not "clump" and separate due to the various diffusion properties of the materials. Evenly distributing diffusion of these metals is desired and can be used to lower the contact resistance which also reduces heating. The thickness of this multi-layer metal stack can vary greatly. In the embodiment to be described, a Ni/Ge/Au metal stack with thicknesses of 400 Å/280 Å/2,000 Å, respectively, was used.

A Rapid Thermal Anneal (RTA) step is then performed on the wafer in order to lower contact resistance. For the embodiment described, the process temperature is rapidly ramped up to ~400° C., held for about 30 seconds and ramped down to room temperature. The temperature and time conditions for the RTA step depend on the metallization, and can be determined using a Design Of Experiment (DOE), as known to those of ordinary skill in the art.

In other embodiments, this step can be performed at an earlier or later stage of the process flow, but is generally done before solder is deposited so as to reduce oxidation of the solder or adhesive metal. A photolithographic process (using a thin layer of photoresist, typically around 1 µm to 3 µm, is used and developed to define the contact openings over the substrate 102 and shorted N contact mesas 105, and active mesas 103 where the heat sink structures will be plated or built up. The next step is deposition of the metal seed layer and is usually a multilayer deposition and deposited by E-beam, resistive evaporation, sputter or any other metal deposition techniques. The metal layers can be chosen such as Ti/Au, 20 Å/600 Å, or many such combinations where the first layer or layers is deposited for adhesion and ease to etch off, and the second layer for conductivity and ease to etch off. The seed layer is continuous over the surface allowing electrical connections for plating, if this technique is used for building up the heat sinks.

In an embodiment, a thick metal is then deposited by plating, to form heat sink 124. However, other methods of deposition can also be used, in which case the metal seed layer is not required. For plating, a photolithographic process is used to define the openings over the openings defined with the previous seed layer resist. The photoresist is removed in the areas where the deposition will occur. The thickness of the photoresist must be chosen so that it will lift off easily after the thick metal is defined and typically ranges in thickness from about 4 µm to about 12 µm. A plasma clean using $O_2$, or water in combination with Ammonium Hydroxide, ($NH_4OH$), is performed to clear any of the resist left on the gold seed layer. The heat sink 124 metal is plated next by means of a standard plating procedure. In the embodiment described, Copper (Cu) was chosen as the metal for plating due to its thermal conductance properties, but non-oxidizing metals, such as Au, Pd, Pt, or the like, that provide good thermal conductance and provide an interface that does not degrade device reliability, could be more appropriate. Plating thicknesses can vary. In the embodiment described, an approximately 3 µm thickness was used.

Next the wafer or sample is placed in a solder plating solution such as Indium (In) plating to form a bonding layer 126. Other metals can be chosen at this step for their bonding characteristics. The thickness can vary greatly. In the embodiment described, approximately 2 µm of plated In was deposited on the heat sinks. However, other solders such as Gold Tin (AuSn) alloys can also be used, and alternative deposition techniques such as sputtering can also be used. After metal deposition is complete, the photoresist is then removed using solvents, plasma cleaned, or a combination of both, as previously described, and the seed layer is etched with a dry or wet etch that etches Au, then etched in a dry or wet etch that etches Ti and/or removes $TiO_2$. The seed layer photoresist is then cleaned off with standard resist cleaning methods. At this point, the VCSEL array substrate is complete and ready for bonding.

The full encasement of the mesas with a thick heat sink material is an important aspect of the embodiment. Since the active regions of the mesas are closest to the edge where the thick heat sink material is formed, there is good thermal conductance, thereby enabling the design of the embodiment to efficiently and effectively remove heat generated by those active regions. As previously noted, this is a significant departure from existing VCSEL array device heat reduction techniques, which place the heat sink material on top of the mesa. These existing or prior designs require heat to move through a series of higher thermally conductive materials (mirrors) or dielectrics, thereby resulting in less efficient and effective heat reduction.

Although some existing designs encompass the mesa with a thin layer of heat sink material, for the purpose of reducing heat, these designs do not take into the consideration the height of the resulting heat sink. By using a thick heat sink layer and adding to the distance between the n-substrate ground potential and the p-contact plane on the heat sink substrate, present embodiments decrease parasitic capacitance of the system as the height of the heat sink layer is increased. Further, in addition to reducing heat, the build-up of additional material increases frequency response. In another embodiment, the dielectric layer 114 covers the entire n-mirror or substrate around the mesas and is not opened so that the heat sink material can completely encompass all mesas and form one large heat sink structure, instead of individual mesas of heat sinks. In this case, the n-contacts would only be needed to extend from the short circuited mesas to the substrate. The heat sinks of the embodiment also improve the operation of the VCSEL array by reducing the amount of heat generated by neighboring mesas. A reduction in thermal resistance within most electrical devices will increase the frequency response of each device. By improving the thermal performance of the VCSEL array device of the present device, a significant increase in the high speed performance of the VCSEL array device is made possible. Furthermore, in this embodiment it is also evident that the extra height given the mesas, because of the thickened heat sinking build up compared to the existing array circuits, reduces capacitance by increasing the distance between the substrate ground plane and the positive contact plate connecting all active mesas in parallel. The resultant effect is a reduction in parasitic impedance of the circuit which also increases the frequency response of the entire array.

Also, the short circuited mesa design, which forms a sub-array surrounding the active regions, allows current flow directly from the fabricated VCSEL substrate to the ground plane on the heat spreader without the use of forming multiple wire bonds. This aspect of the embodiment reduces the complexity of fabrication, and also reduces parasitic inductance from the multiple wire bonds exhibited in the existing arrays. The short circuited mesa design, when flipped chipped to the heat spreader substrate, forms a coplanar waveguide which is beneficial to the frequency response of the array. This design feature also enables simpler packaging designs that do not require raised wire bonds, which also impact reliability and positioning.

To allow for control of the optical properties of the VCSEL devices in the array, micro-lenses can be fabricated on the substrate side of the array. Since all the electrical contacts are made to the epitaxial side of the semiconductor wafer, the other side of the wafer is available for modifications, including thinning the substrate, polishing the substrate surface, fabrication of micro-lenses or other optical elements, including diffractive optical elements, metal or dielectric gratings or special coatings, such as anti-reflection coatings to reduce reflection losses at the substrate surface.

Figure 5A:
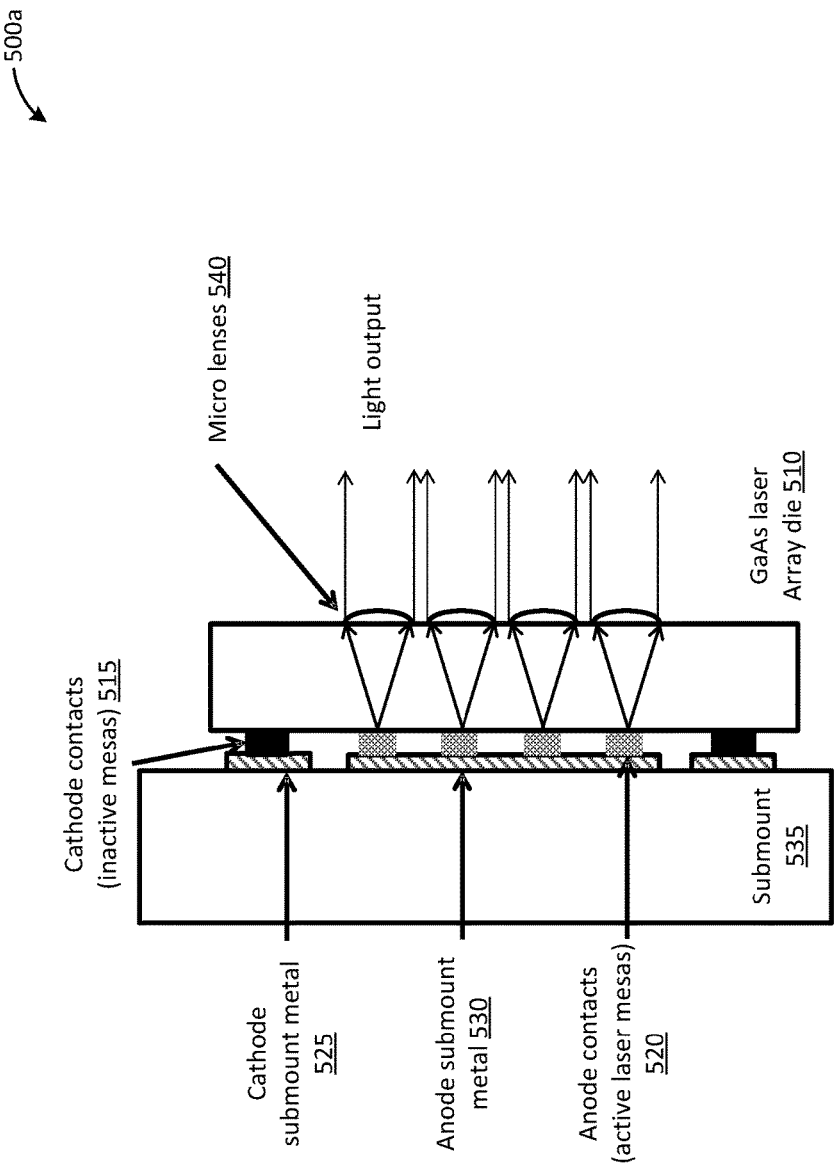
FIGS. 5A and 5B are diagrams of example VCSEL array devices.

A simplified process sequence to produce the VCSEL array device with micro-lenses on the substrate (light-emitting surface) side of the device, as depicted in FIG. 5A, may start with thinning the wafer to a desired thickness by mechanical and chemical-mechanical polishing processes that are well known in the industry. An alignment step may be performed with a photoresist pattern on the substrate side of the wafer aligned to features patterned previously on the laser mesa side of the wafer. This pattern is used to produce a pattern in a metal or dielectric thin film on the substrate side of the wafer. The pattern can serve as an alignment reference for further process steps on the substrate side of the wafer as well as mechanical standoff features to protect the substrate surface during the flip-chip bonding step.

The micro-lenses can be fabricated on the substrate surface by a variety of different processes. Refractive micro-lenses can be patterned in photoresist as cylindrical structures that can be reflowed at high temperature. Surface tension in the melted photoresist causes it to have a hemispheric shape. That shape can be etched into the substrate surface with appropriate plasma or reactive ion etch processes that erode the photoresist at a controlled rate while etching the underlying substrate. Other techniques for fabricating refractive micro-lenses include grey-scale lithography and jet deposition. Diffractive lenses (Fresnel lenses) can also be fabricated on the substrate using fabrication processes including grey-scale lithography, embossing of a polymer coating, or binary lithographic patterning.

Figure 2:
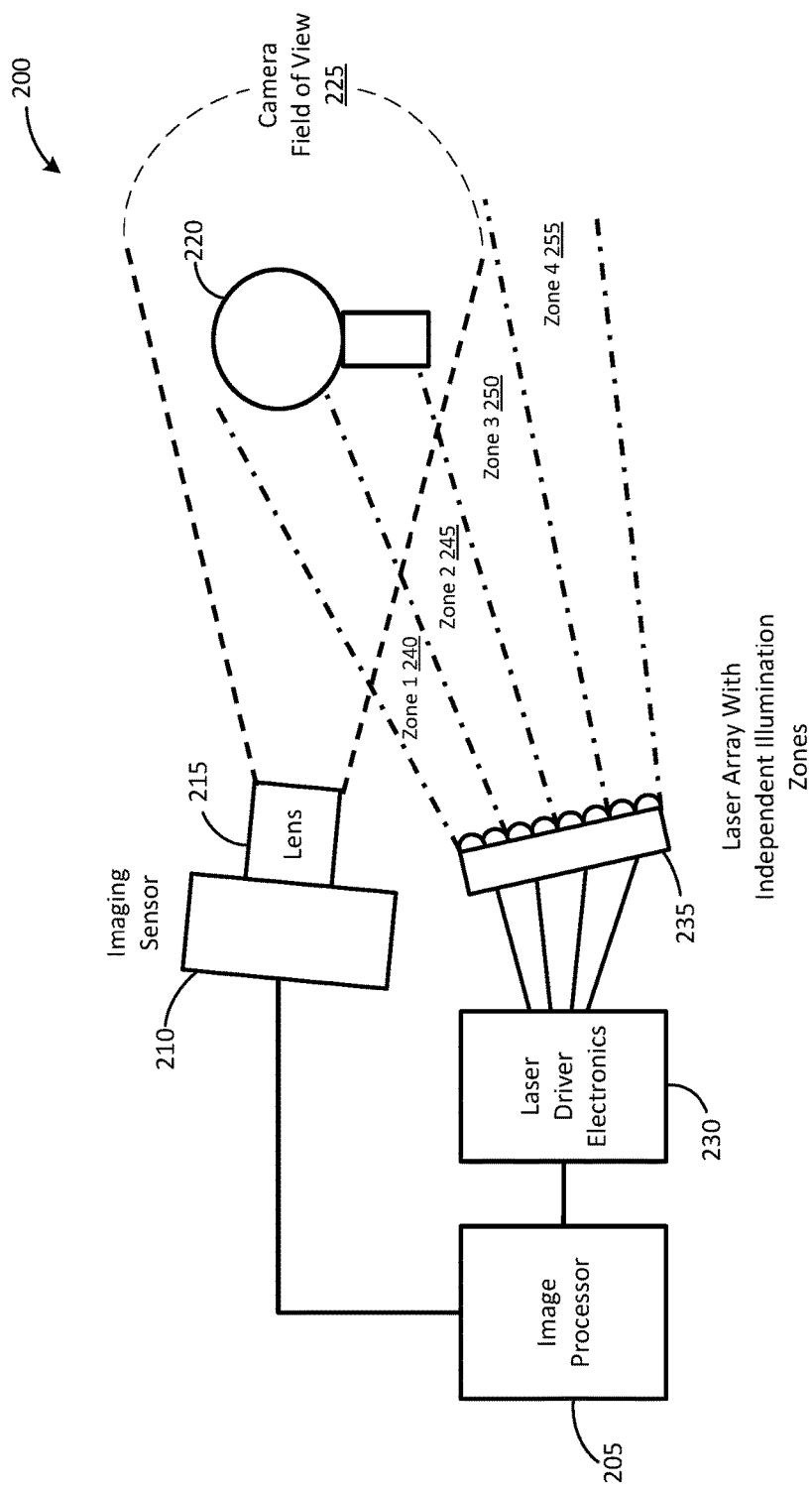
FIG. 2 is a diagram of an example optic system including a multi-zone illuminator that provides illumination to multiple zones of a field of view of an image sensor.

FIG. 2 depicts an optic system including a multi-zone illuminator and an imaging sensor both in communication with an image processor/computing device. The multi-zone illuminator may include a laser array 235 providing illumination for multiple independent zones: zone 240, zone 245, zone 250, and zone 255. It should be appreciated that the laser array 235 may have number of different zones, defined in different ways, such as by angle, distance, etc., as will be described in greater detail below. The laser array 235 may be controlled through laser driver electronics 230, which may separately communicate with each of multiple sub arrays of laser array 235 (e.g., with each sub array corresponding to a different zone, as illustrated). The laser driver electronics 230 may determine and provide a level of current to each of the sub arrays of array 235 to control an illumination intensity provided by each sub array. An image processor 205 may be in communication with the laser driver electronics 230 and/or the laser array 235, and may control or dictate the amount of current delivered to each sub array, to control the amount of illumination intensity provided in each of zones 240-255.

In some aspects, the image processor may also be in communication with one or more imaging sensors 210. Imaging sensor 210 may include a lens 215 that may capture image data corresponding to a camera field of view 225. In some cases, the data captured by the imagine sensor 210 may be enhanced by specific illumination or light provided to various zones or areas/volumes of the field of view 225. In some cases, the zones 240-255 may correspond to areas at a certain distance from the image sensor 210/lens 215, or may correspond to volumes within the field of view 225.

In some cases, the image processor may obtain information from the image sensor 210, including information defining or specifying the field of view 225 of the image sensor 210, such as by angle, distance, area, or other metrics. In some cases, the information may include a subset of the total field of view 225 that is of particular interest, such as including one or more objects 220, defined by a distance from the image sensor 210, a certain angle range of the field of view 225, etc. In some cases, this information may change and be periodically or constantly sent to the image processor 205, such as in cases of tracking one or more objects 220. The image processor may receive this information, and in conjunction with laser driver electronics 230, may control the laser array 235 to provide different illumination intensities to different zones 240-255. In some cases, the laser array 235 may be controlled to provide a determined optimal level of illumination to different zones 240-255. The optimal level may be determined based on any number of factors, including physical characteristics of the image sensor 210/ lens 215, characteristics of the object or objects of interest 220, certain areas of interest within the field of view 225, other light characteristics of the field of view 225, and so on.

In some aspects, the applications or devices, such as imaging sensor(s) used for detecting or tracking moving objects, such as object 220, tracking or detecting gestures of a user, etc., that can utilize the described multi-zone illuminator 235 may already have a computational unit (e.g., corresponding to image processor 205) processing the image data. In these cases, the multi-zone illuminator 235 may be connected to existing systems and function via a software/ hardware interface. The software interface may be modified to include detection of the illumination level of different zones of the image field of view, corresponding to the illumination zones that are provided by the illuminator 235, and provide feedback signals to the laser array driver electronics 230 to modulate the light intensity for each zone.

In one example, the modulation of the light intensity can be performed through typical laser or LED driver electronic circuits 230 that control the direct drive current to each laser 235 or commonly-connected group of lasers (sub arrays) or use pulse-width modulation of a fixed current drive to each laser or commonly-connected group of lasers or other current modulation approaches. Since they are separately connected to the driver electronics, the illumination zones 240-255 can be modulated independently, including modulation in synchronization with electronic shutters in the imaging electronics. The illumination zones 240-255 can also be driven sequentially or in any other timing pattern as may be preferred for the image processing electronics.

The system 200 depicted in FIG. 2 has four independent illumination zones 240-355, each zone independently driven by the driver electronics 230 to control the intensity of illumination in each zone. The illuminator 235 is depicted as a single module with four separately connected laser arrays or sub arrays. The optical separation of the laser array outputs into separate beams addressing different parts of the imaging system or camera field of view 225 is described in more detail below. Optical system 200 may have any number of illumination zones, limited by the practical issues of cost and complexity of providing for the additional lasers, connections to the laser arrays and the driver electronics for each independent laser or laser array in the module.

Figure 3:
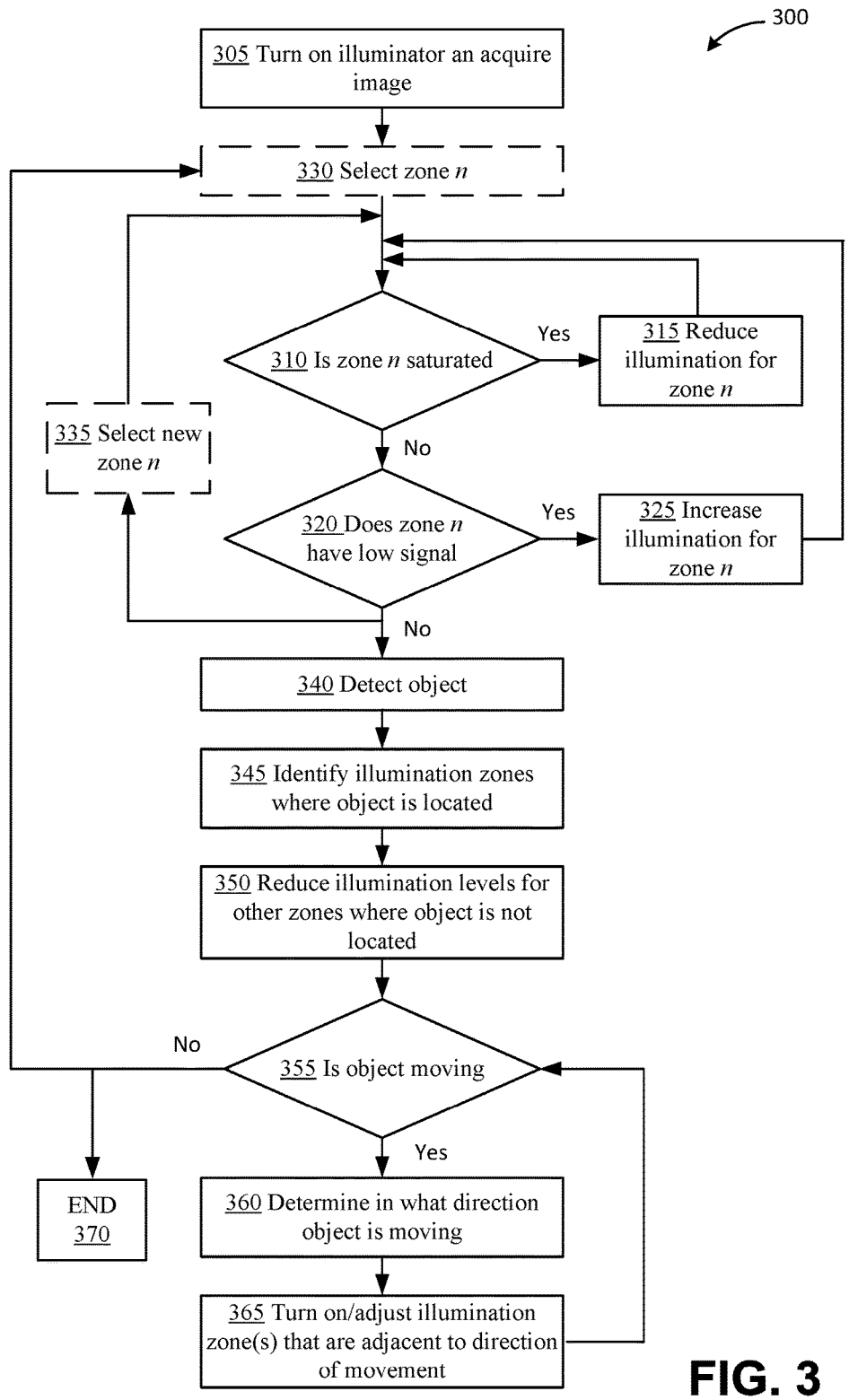
FIG. 3 illustrates an example process for dynamically controlling illumination levels in one or more zones provided by a multi-zone illuminator.

In some aspects, individual illumination zones, such as zones 240-255 may be dynamically controlled, such that one or more zones are turned on and off, or the illumination intensity of one or more zones modified, in response to feedback from the image sensor 210. Dynamic adjustment of the illumination pattern resulting from multiple zones 240-255 may be carried out or controlled by the image processor 205. FIG. 3 illustrates an example process 300 for automatically controlling illumination of one or more individual zones in the camera field of view 225 to maximize the dynamic range of the system. As described below, process 300 may be performed by image processor 205. However, it should be appreciated that process 300 may be performed by one or more other devices, such as in combination with image processor 205.

Process 300 may begin at operation 305, where the full field of view of the system (e.g., filed of view 225 of image sensor 210) may be illuminated by all the illuminator zones 240-255 at once. In some cases, the illumination power level utilized at operation 305 may have been previously calibrated for an efficient starting point, may be selected based on the field of view 225 of the image sensor 210, or may be full intensity, etc. The image processor 205 may obtain/detect from the image sensor 210, which zones 240-255 are saturated (high signal without any range for further increase), at operation 310, and/or which zones have a low (intensity) signal at operation 320. Each zone 240-255 can be adjusted to reduce illumination to reduce the signal level from the saturated zones, at operation 315, and may be adjusted to increase illumination for low signal zones at operation 325. The process of adjusting illumination in each of n zones can happen in sequence through the zones, one at a time, or if the image processor has the capability, it can be done simultaneously for multiple zones.

In the example illustrated, a first zone n may be selected at operation 330. It may then be determined if the zone is saturated at operation 310. If the zone is saturated, the illumination level or intensity for that zone may be reduced at operation 315. Process 300 may then loop back to operation 310, to re-check if the adjustment at operation 315 reduced the illumination of that zone to an appropriate level. If the zone has a low signal, as determined at operation 320, the illumination level for that zone may be increased at operation 325. Once the selected zone is adjusted to provide an optimized illumination level for the zone, a new zone may be selected at operation 335, and operations 310, 315, 320, 325, and 335 may be performed until there are no more zones left, or until a select number of zones are calibrated, etc. In some cases, an area of interest, for example, may be selected or configured, such that only zones in the area of interest are adjusted via operations 310-335. In other cases, the area of interest may be automatically detected/configured, for example, based on detected movement in the field of view 225.

The image processor 205, for many applications, may detect objects of interest at operation 340, such as a human subject's eyes or face. As the illumination is adjusted at operations 310-325, the image processor 205 may alternatively or additionally identify one or more subjects or objects of interest, at operation 340, and identify illumination zones corresponding to the location of the subject(s) or object(s) at operation 345. The identification process may be more efficient with the optimal illumination level for maximum signal to noise ratio(s). Once the object of interest is identified, the illumination levels for zones that do not contain the object can be reduced, at operation 350, for example, to save power and reduce heating in the laser array and the laser driver electronics.

In some aspects, the object of interest may be tracked by the illumination system, for example, by first detecting if the object is moving, at operation 355. As the object moves within the camera field of view 225, the image processor 205 may determine in what direction the object is moving, at operation 360. Based on the locations of the illumination zones 240-255, the image processor 205 may determine towards which zones the object is moving. The image processor 205 may turn/on or adjust (e.g., increase) the illumination level of these zone or zones to provide optimized illumination levels to better capture images of the object and/or to better track the object as it continues to move, at operation 365. As the relative efficiency of each zone can be stored in and accessed from memory, the initial illumination level of the zone the object is moving into or towards can be set relative to the level that was previously used in the zone that was illuminating the object before it moved. Stated another way, the current illumination level set for a zone in which the object is moving into or towards (future zone) may be set based on an illumination level in a current or previous zone.

The image processor 205 may periodically readjust illumination levels for each zone, while looking for additional objects of interest or changes in the image that may affect the system performance. For example, process 300 may continue to cycle through operations 355, 360, and 365 for an object until the object is no longer moving, at which point, process 300 may end at 370, or may start loop back to the operations 330 or 310, and continue adjusting illumination levels and/or tracking the same or different objects. In some cases, multiple objects may be identified, and operations 340-365 may be performed in parallel for each of the multiple objects. In this instance, illumination levels for different zones may be adjusted based on illumination zones being adjusted for other objects.

Figure 4:
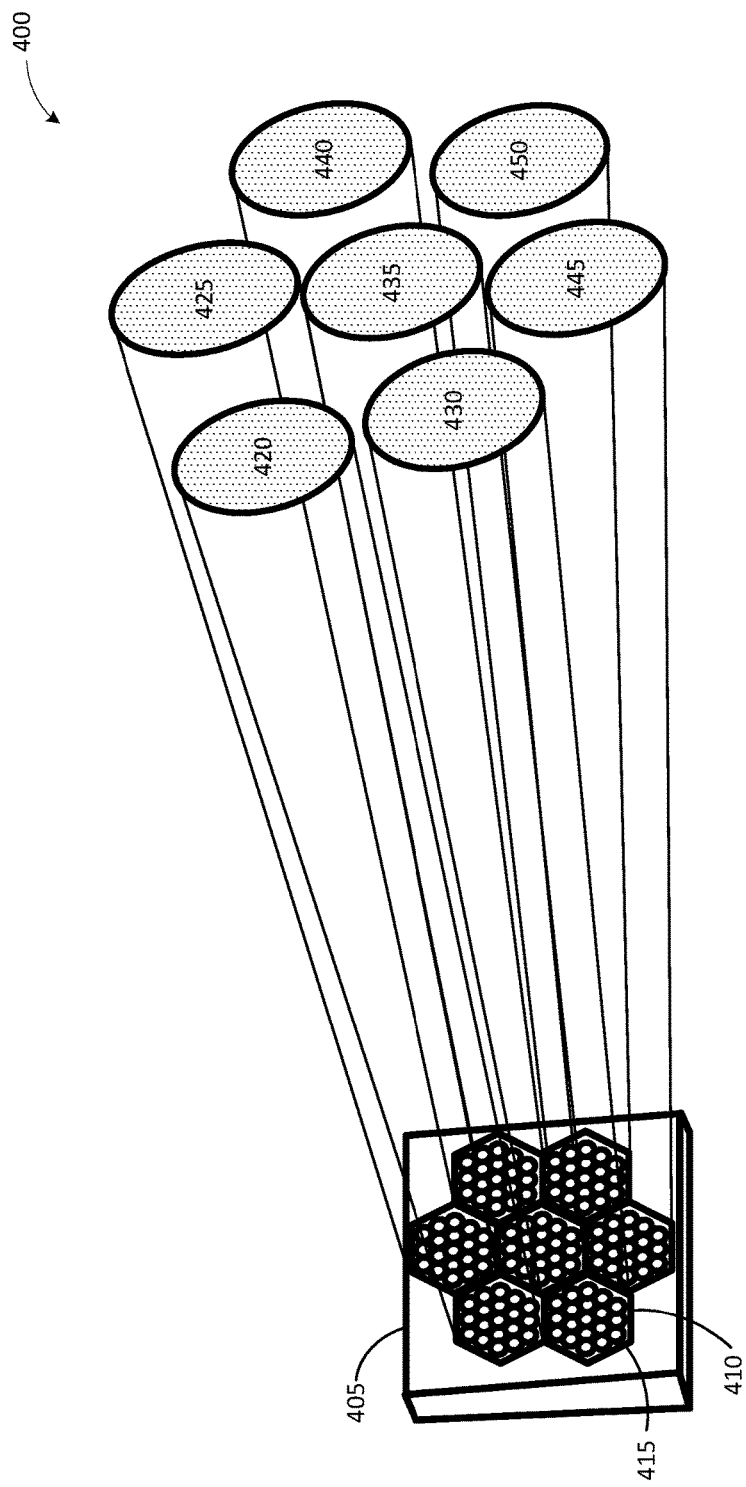
FIG. 4 illustrates an example illumination field produced by an illumination module or array including seven laser arrays.

FIG. 4 depicts the illumination field provided by an illumination module or illuminator 405 with seven laser arrays 410 distributing the light in a two-dimensional pattern represented by projected areas 420-250 a certain distance from the illuminator 405. Each laser array 410 may include a number of individual lasers 415. In the example illustrated, each laser array 410 includes 19 individual laser devices; however, it should be appreciated that each laser array may include any number of laser devices, and one or more laser arrays of module 405 may include a different number of lasers. In this example, the position of the illumination zones 420-450 correspond to the location of the laser arrays 410 in the module 405. As will be described in more below, this correspondence is not necessary, such that the location of one or more emitting laser arrays 405 on the module 405 may not directly correspond to the location (e.g., direction and relative position) of the illumination field 420-450 of that array. In some cases, a two-dimensional arrangement of laser arrays 410 on the module 405 can be configured with the appropriate micro-optics to generate a linear (one-dimensional) sequence of illumination zones.

One embodiment of the illumination module is depicted in FIG. 5A. One example of an illumination module 300a is described in more detail in commonly owned U.S. Pat. No. 8,848,757, issued Sep. 30, 2014, filed Mar. 31, 2011 and entitled "Multibeam Arrays of Optoelectronic Devices for High Frequency Operation." The laser arrays 505 are fabricated on one surface of a Gallium Arsenide die 510 in a process that allows both the cathode 515 and anode 520 contacts to be made on the same surface of the die. Those contacts are made through metal patterns 525, 530 on the surface of a separate submount die 535 that may be made of ceramic, fiberglass resin printed circuit board material or other materials suitable for electronic packaging or circuit fabrication. The two die 510, 535 are aligned and bonded using conventional flip-chip bonding processes. This structure allows fabrication of micro-optical elements 540 in the substrate of the laser die. The micro-optical elements 540 may be refractive micro-lenses as shown, or may be diffractive elements. In either case the micro-optical elements 540 can be etched directly into the substrate material using well-known photolithographic processes, forming a completely monolithic optical device. This approach has many advantages in producing a rugged device with minimal assembly steps. An anti-reflection coating may be added to the surface of the substrate to minimize loss of light from internal reflections from the surface.

Figure 5B:
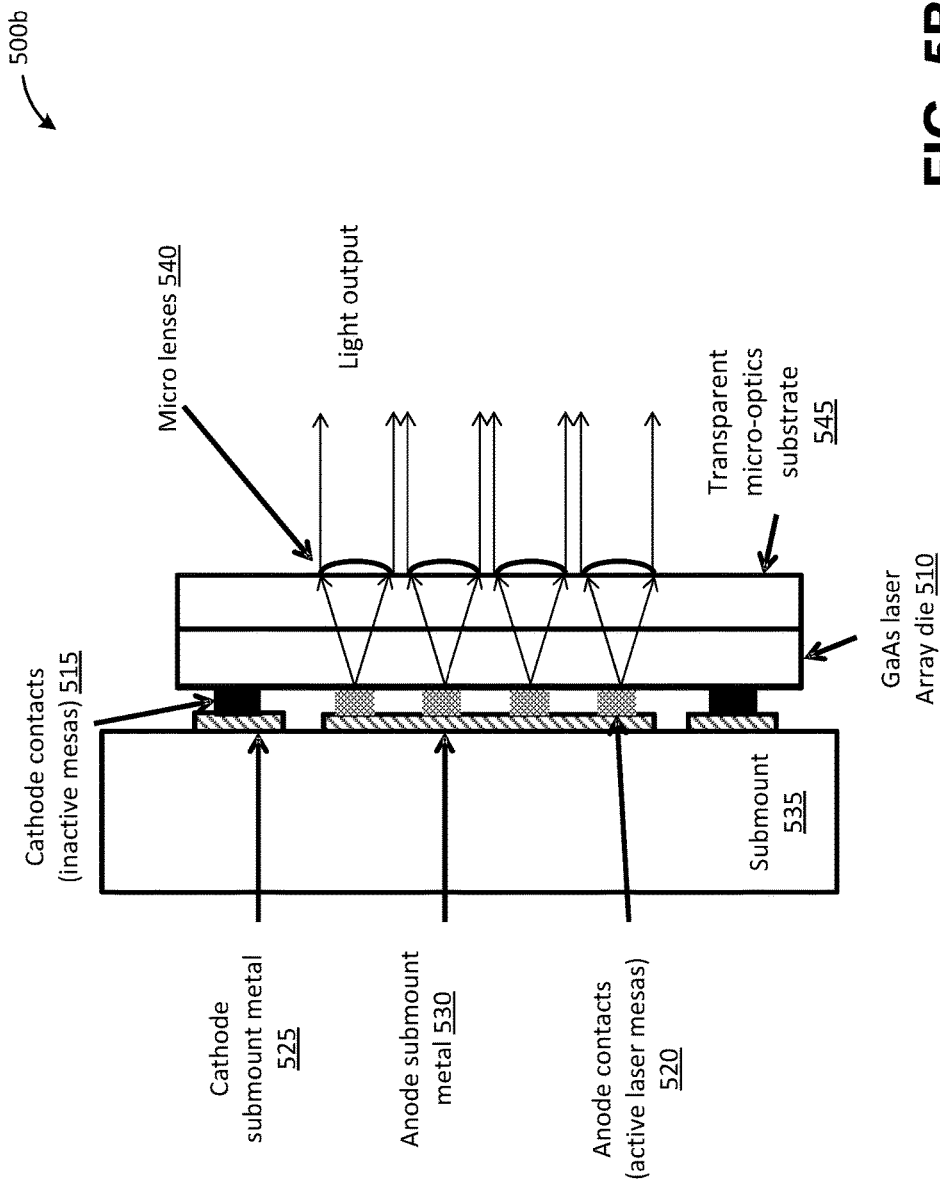

An alternative embodiment of the illumination module is shown in FIG. 5B. This structure 300b has the lasers fabricated in a Gallium Arsenide die 510 as described previously. The laser die 510 is bonded to a submount 535 that enables the electrical connections as described above. The micro-optical elements 540 in this case are fabricated in a separate substrate 545. The two parts 510 and 545 are aligned to each other and either bonded together as shown or assembled together with an air space between the parts using active or passive alignment and assembly processes well-known to the optoelectronic industry. The micro-optical substrate 545 can be the same material as the laser array 510, or may be a different material such as glass or transparent polymer. The use of a different material allows for a variety of fabrication processes to be used for fabrication of the micro-optical elements 545. Anti-reflection coatings may be used on the inner and outer surfaces of the micro-optical substrate 545 to minimize losses from reflections. This approach has the advantage of separately yielding the laser array 510 and the micro-optical elements 545 at the cost of additional assembly processes.

In either of these embodiments, the submount 535 allows for separate electrical contact to individual lasers or groups of lasers through the patterned contact metal 525, 530 on the surface of the submount 535. This allows for separate driver circuit current channels for each independently addressed laser or group of lasers.

Figure 6:
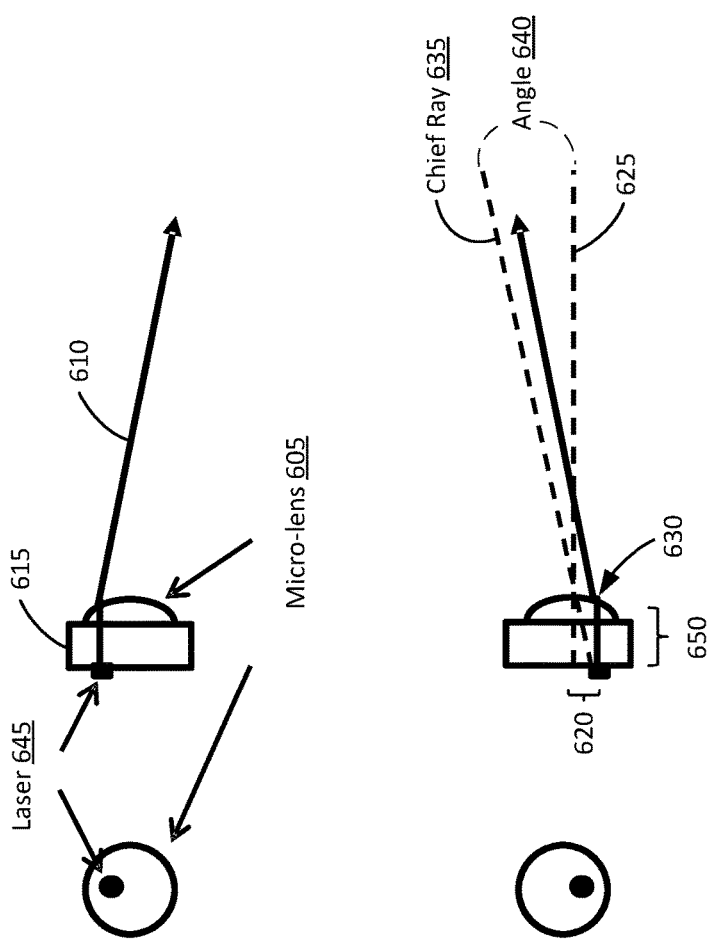
FIG. 6 illustrates an example light path produced by a micro-lens that may be implemented on the illumination arrays of FIG. 3A or 3B.

Each separately addressed laser or group of lasers can have an output beam whose direction and angular spread is determined by the micro-optical elements 340. FIG. 6 depicts an example micro-lens 605, which may be positioned on the output side of substrate 545 as described in reference to FIGS. 5A and 5B. The micro-lens 605 can produce an output beam 610 that leaves the substrate (here depicted as element 615) at an angle to the surface perpendicular. The offset 620 of the lens axis 625 relative to the axis 630 of the laser 645 (a distance d) determines the angle at which the beam 610 propagates from the die surface or substrate, such as die 510 or substrate 545. The chief ray 635, defined as the optical ray from the center of the laser source through the geometrical center of the micro-lens 605, defines the angle of propagation 640 (A 640), which be represented as tangent (A)=d/f, where f is the focal length 650 of the micro-lens 605 in the same distance units as d. There are other factors to considered, such as diffraction and the relative size of the laser aperture and micro-lens aperture in detailed design of the illuminator.

If the micro-optical element 605 is a diffractive structure, similar to a Fresnel lens or curved diffraction grating, then the physical offset in position of the micro-optic is not necessary and the diffractive structure is designed to produce the desired angular direction of the beam by well documented mathematical techniques.

The angular spread of the emitted beam 610 from each individual laser 645 or a group of lasers can also be controlled by the micro-optical elements. Each micro-lens 605 can produce a beam 610 that has a lower angular divergence, or a larger angular divergence, than the divergence of the laser 645 itself by the choice of focal length 650 of the lens. The focal length 650 of the lens is determined by the radius of curvature and index of refraction of the micro-lenses. The focal length of the micro-lens can decrease the divergence of the light emitted from a single emitter by acting as a collimating lens. This effect is limited by the relative size of the emitting aperture of a single laser to the size of the micro-lens. A larger source size relative to the micro-lens aperture will increase the divergence of the beam even when the source is located at the focal distance from the lens for best collimation. If the micro-lens is fabricated so that its focal length is shorter or longer than the best collimation focal length, the beam from that emitter will diverge more rapidly than from the divergence from the same laser emitter without a micro-lens.

Figure 7:
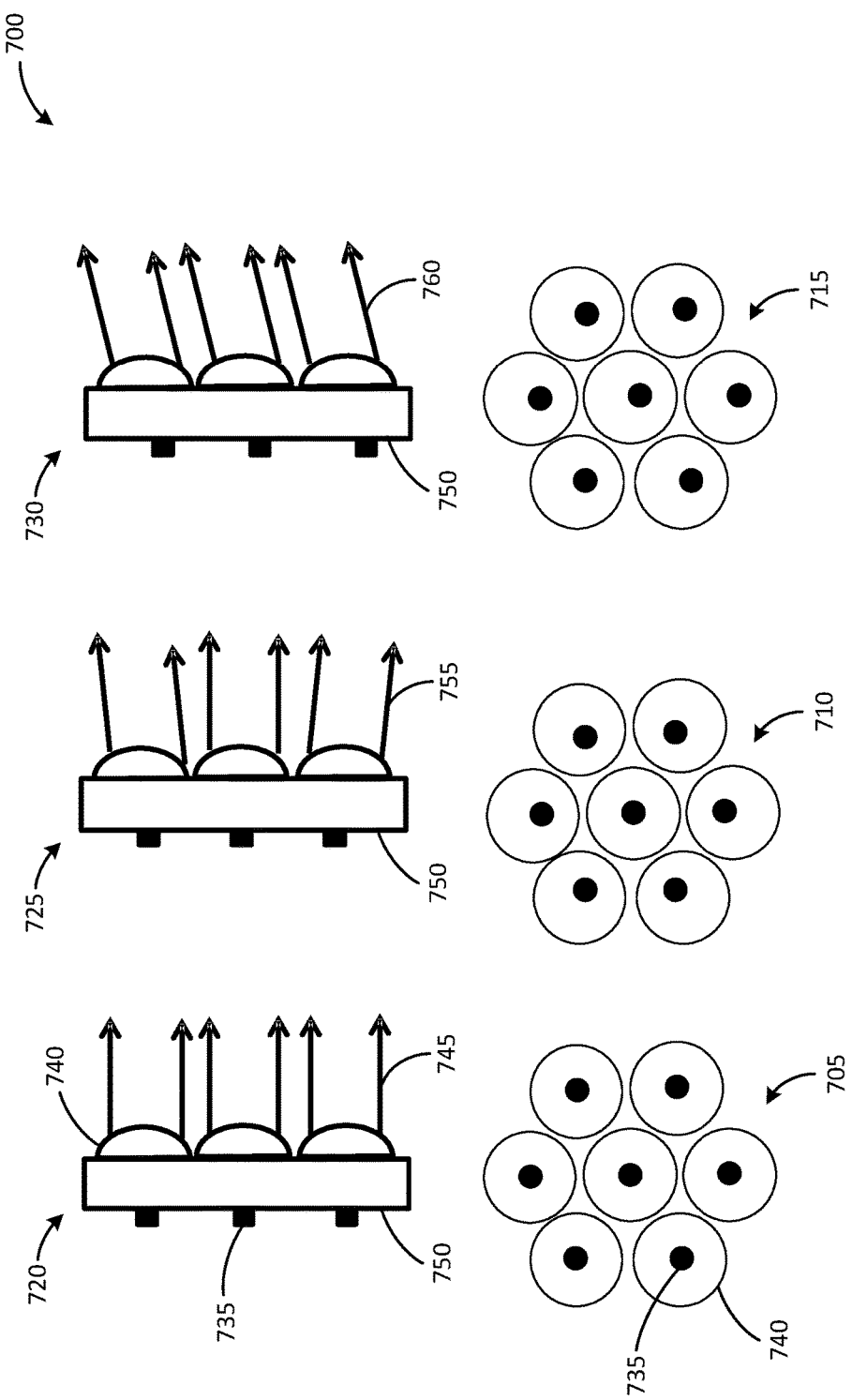
FIG. 7 illustrates example light paths produced by a group of seven micro-lens having different radial offsets, which may be implemented on the illumination arrays of FIG. 5A or 5B.

In addition, a group of lasers can have a collective beam that has greater divergence in the far field by a radial offset of the micro-lenses, as shown in FIG. 7. Three different groups 705, 710, and 715, of micro-lenses and lasers, such that form a laser array, are illustrated, each with lasers/micro-lenses having different offsets in the position of the micro-lenses relative to the lasers to produce beams having different directions 720, 725, 730, which will result in different illumination patterns.

Micro-lenses can be used with combined linear (between each micro-lens) and radial offsets (described above) to produce beams from a group of lasers that have both a specified angle of propagation in the field of view of the imaging detector and a specified angular spread. By designing a laser die that has several separately connected groups of lasers, each with micro-lenses aligned to produce a beam to illuminate a separate angular zone within the field of view of the detector, a complete illumination system may be fabricated in a single compact module.

As depicted in FIG. 7, each laser array 705, 715, 720 may include seven laser devices 735 each having a corresponding micro-lens 740, arranged with one laser in the center of the array, and 6 lasers surrounding the center laser in a circular formation. Each of the seven lasers 735 in array 705 may have zero radial offset (e.g., positioned in the center of micro-lens 740) to produce beams 745 directed perpendicular to the substrate/laser die 750. In this case, if the micro-lenses are fabricated with focal lengths (or a radius of curvature corresponding to a focal length) that equal the optical path length to the emitters for best collimation, the array will emit a relatively narrow beam (the combined beams of the 7 individual laser emitters) in a direction perpendicular to the device surface.

The center laser of array 710 may have a zero radial offset, while the six outer laser devices of array 710 may have a radial offset that places the lasers toward the center of array 710/center laser. Array 710 may produce beams 755 that diverge to produce an illumination pattern that expands as distance from the array 710 increases. The 6 outer micro-lenses are offset away from the center axis by a fixed offset that is a fraction of the micro-lens diameter so that significant amounts of light from the lasers are not incident outside the corresponding micro-lens. If the array is larger, then the next ring of micro-lenses (12 additional micro-lenses in a hexagonal array layout) will be two times the offset value relative to the corresponding laser axes. This radial offset can be easily realized in designing the array by using a different pitch for the hexagonal array of lasers than for the hexagonal array of micro-lenses and aligning the central laser and micro-lens to each other. The result is that a radial offset between the micro-lenses and laser emitters that increases by the pitch difference for each larger ring of the array. The example shows a radial offset that places the micro-lenses farther from the array center than the emitter apertures by using a larger pitch for the micro-lens array than the laser array. This will result in a combined beam that diverges more rapidly than the beam divergence due to just the micro-lens focal length. An alternative design can use a smaller pitch for the micro-lens array than for the laser array. That design will create a combined beam that converges for a short distance before the beams cross each other and diverge apart. That approach may have utility for illumination of objects at a short distance for microscopy, material heating or other applications.

All of the lasers of array 715 may be globally offset in the same direction and the same distance, for example, to produce beams 760 that are all directed in the same direction, offset from the beams 745 of array 705. As described previously, the offset of the micro-lenses relative to the location of the laser emitting aperture causes the beam to be emitted at angle defined to first order by the direction of the chief ray. This allows the calculation of how much offset is required to get a desired angle of deviation from the perpendicular to the illuminator surface. More precise calculation of the global offset to direct a combined beam of emitters in desired direction can be done with ray tracing techniques or beam propagation calculations. Both radial and global offsets can be combined in a single array (e.g., combining aspects of arrays 710 and 715), so that both the divergence and direction of the combined beams may be simultaneously determined by the design of the micro-lenses and laser array. It should be appreciated that arrays 705, 710, and 715 are only given by way of example. Other configurations, other numbers of lasers, etc., are contemplated herein.

Figure 8A:
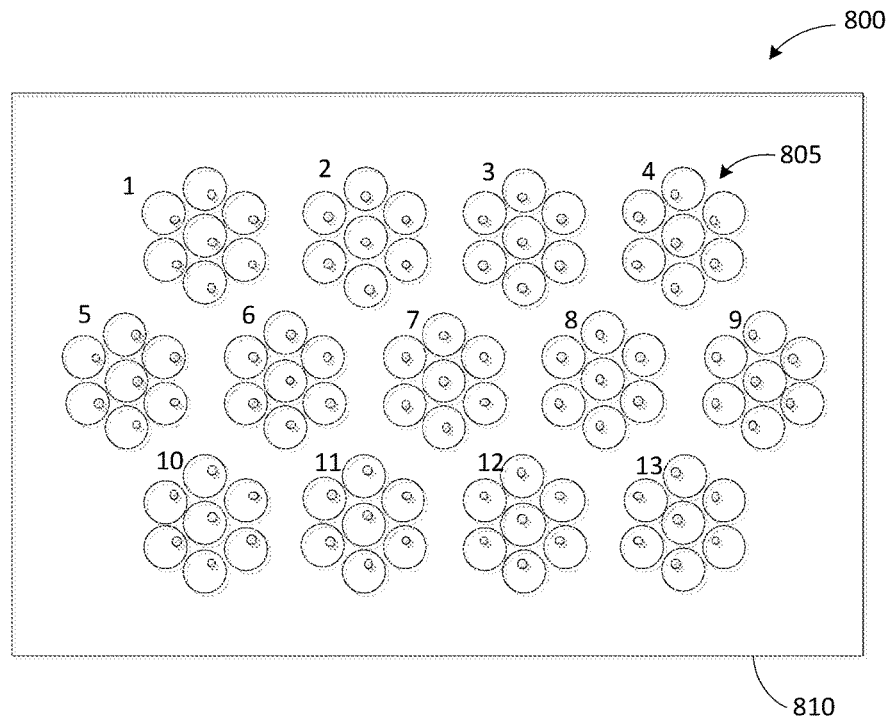
FIGS. 8A and 8B illustrate a group of 13 sub arrays, with each sub array having a certain radial offset, and the corresponding illumination pattern provided by the group of sub arrays.
Figure 8B:
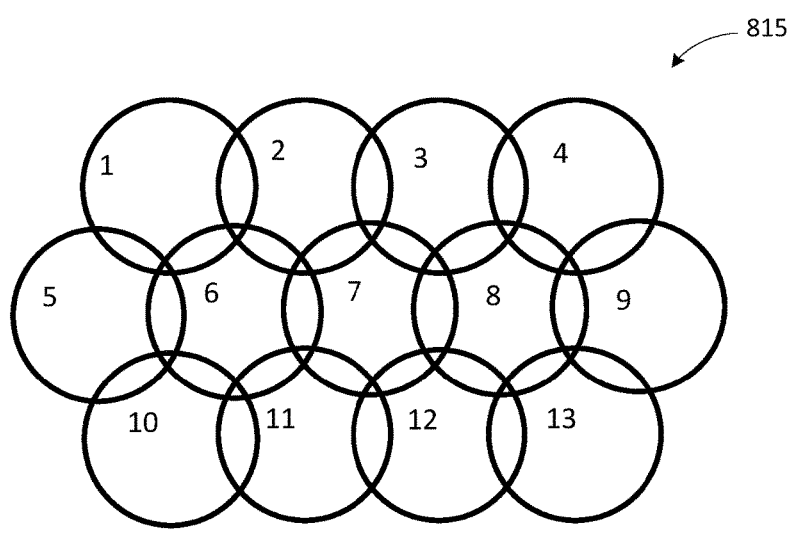
Figure 9:
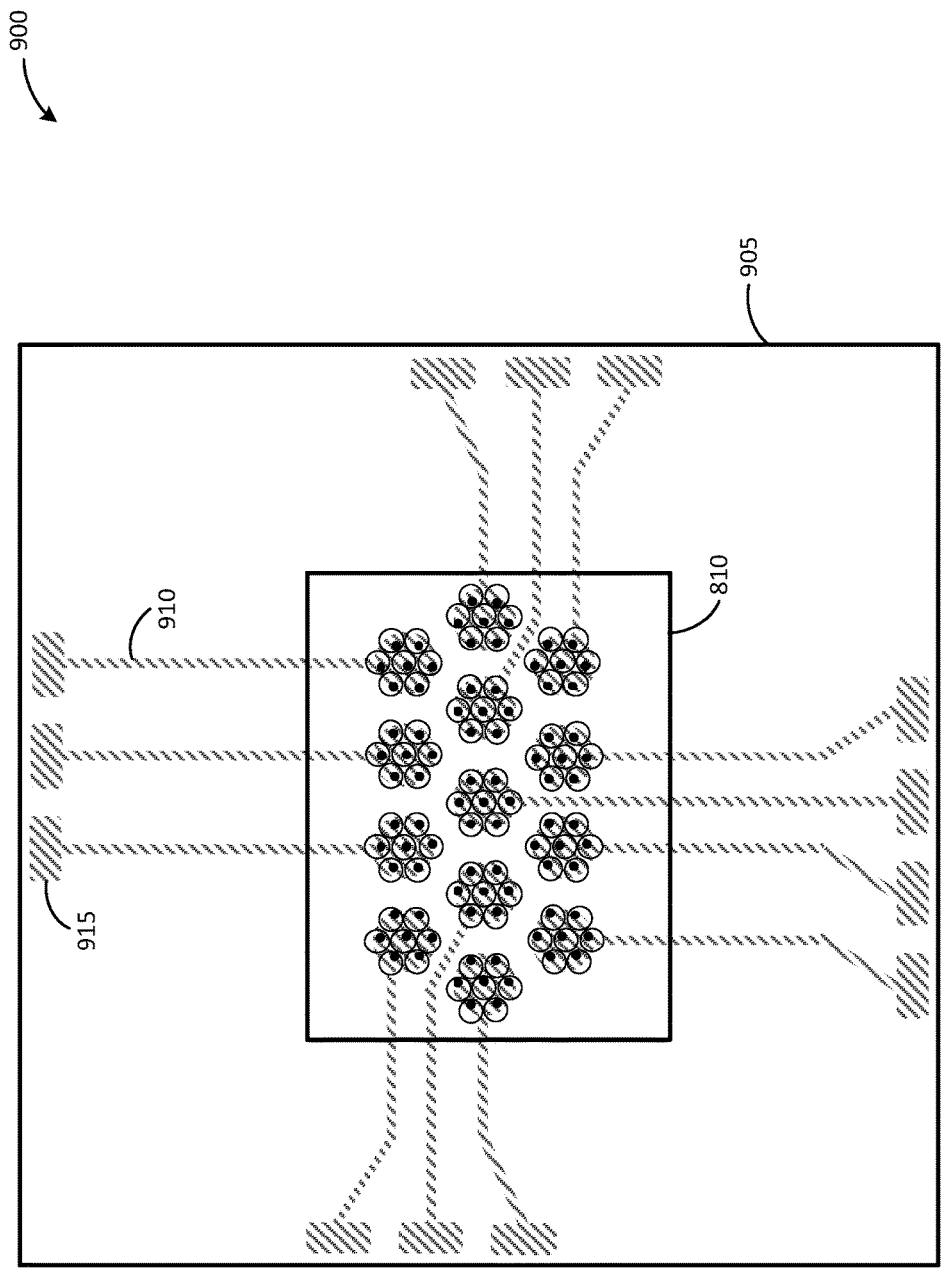
FIG. 9 is a diagram of a sub mount showing electrical connections to each of the 13 sub arrays illustrated in FIG. 8A.

FIGS. 8A, 8B, and 9 show an example of a 13-zone illuminator 800. FIG. 8A shows the 13 laser arrays 805 numbered 1-13, on a single die 810. FIG. 8A depicts the lenses corresponding to each laser on the substrate side of the laser die 810. The laser locations are shown as dots. The lasers may be fabricated on the opposite side of the die, with the light transmitting through the substrate. The resulting illumination pattern 815, as if projected on a screen some distance from the device, is shown in FIG. 8B. In this example, the pattern 815 covers approximately a 45°×25° field of view, with each circle depicting a beam of approximately 12° diameter. The overlap shown is intentional to give a uniform illumination pattern across the whole field when all the beams are turned on at a similar power level. In this design, all the beam shaping is done by the micro-lenses, such that there is no need for an external lens. FIG. 9 depicts a top view 900 of the laser die 810 positioned as bonded to the submount 905. An anode metal pattern 910 is illustrated on the submount 905. The bond pads 915 on the submount 905 allow electrical connection, through conventional semiconductor packaging technology, to the laser driver circuits, such as driver 130 described in reference to FIG. 1. There is also a cathode metal pattern (as described above in reference to FIG. 1, but not shown here) that may fill much of the space between the anode metal 915 and allow a return current path.

The example in FIGS. 8A and 8B show a correspondence between the position of the laser array 805 that produces each beam with the location of the beam in the far field, such as illumination pattern 815. This correspondence, however, is not necessary. The location of the laser arrays 805, with associated micro-lenses, on the laser array die 810 do not necessarily determine the location of the beam in the field of view of the detector. The location of a beam in the far field or field of view of an associated image sensor or camera is almost entirely due to the angular displacement and spread of the beam as determined by the micro-lens properties and position. Relocating the array 805 associated with the beam to a different position on the laser die 810 only shifts the beam by the very small distance (a few millimeters at most) that it is shifted on the die 810. This shift becomes inconsequential once the beams have expanded over a small distance. This property can be used to enhance the eye safe tolerance for the illuminator. The apparent size of a light source has a direct influence on the damage tolerance of the retina, as the larger source cannot be imaged to as small a spot on the retina as a smaller source. This is well documented in the laser safety standards. If an observer is close to the array 800 depicted in FIGS. 8A, 8B, and 9, there is the possibility of the light from adjacent beams to be imaged by the observer's eye and the eye safety threshold to be exceeded, even if the individual beams are determined to be safe at the operating power level. This safety concern is due to the fact that the arrays that are the source of the adjacent beams are adjacent to each other themselves and will be imaged in close proximity to each other on the observer's retina. This problem can be prevented by placing the laser arrays that are sources for beams that are directed to adjacent angular spaces in the far field of the lasers further away from each other so that their sources cannot be imaged adjacent to each other by the observer's eye.

FIGS. 10A-10F depict the interactions 1000 of beams of light 1005 on an eye 1010, such as a human eye, including retina 1015. By changing the configuration (e.g., linear and radial offsets) of one or more lasers and/or micro-lenses, safety concerns with certain configurations of a multi-zone illumination array may be mitigated and/or negated.

Figure 10A:
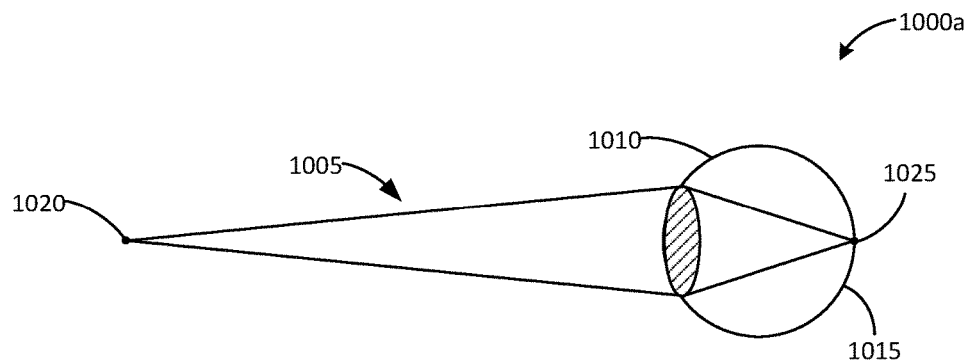
FIGS. 10A-10F illustrate diagrams of various illumination patterns and the resulting interactions with an eye.

As depicted in diagram 1000a of FIG. 10A, the eye damage threshold is lowest for a point source 1020 that will image on the retina 1015 as a small spot 1025 with a very high intensity (in Power/Area i.e. W/mm2).

Figure 10B:
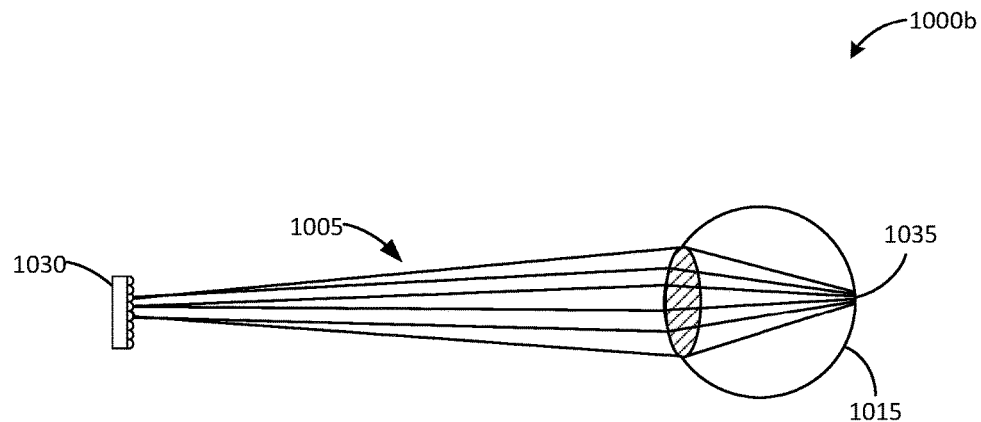

As depicted in diagram 1000b of FIG. 10B, multiple point sources 1030 that are close together and radiating in the same direction will focus to multiple spots 1035 close together on the retina 1015. In eye safety standards, if the sources 1030 are close enough together, they are treated as a single extended source. The allowed exposure level may be higher because the image 1035 on the retina 1015 may be larger, but the combined exposure (in intensity) may also be higher.

Figure 10C:
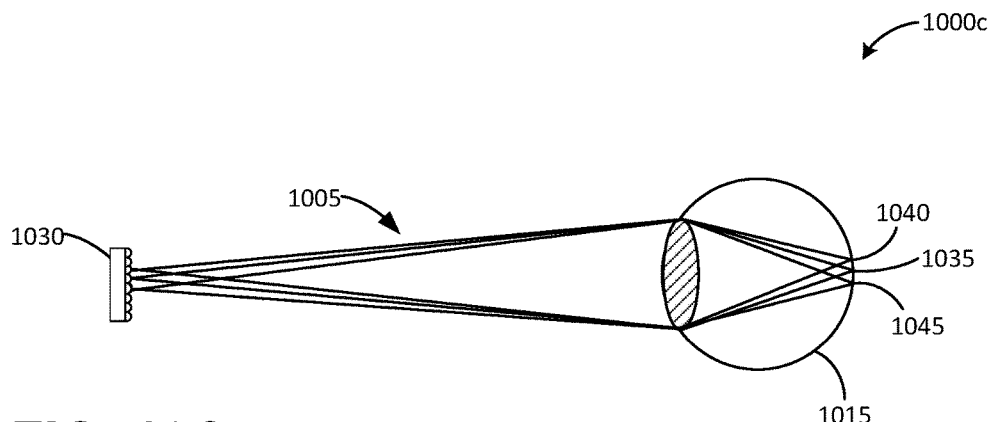

As depicted in diagram 1000c of FIG. 10C, if the multiple point sources 1030 are radiating in the same direction, but are far enough apart, they will focus to multiple spots on the retina 1035, 1040, 1045 that are separated from each other. If that separation is large enough, then the exposure from each spot 1035, 1040, 1045 is considered a separate event and the intensities on the retina 1015 are not combined. The laser safety standards define how these situations are calculated and the results depend on many factors.

Figure 10D:
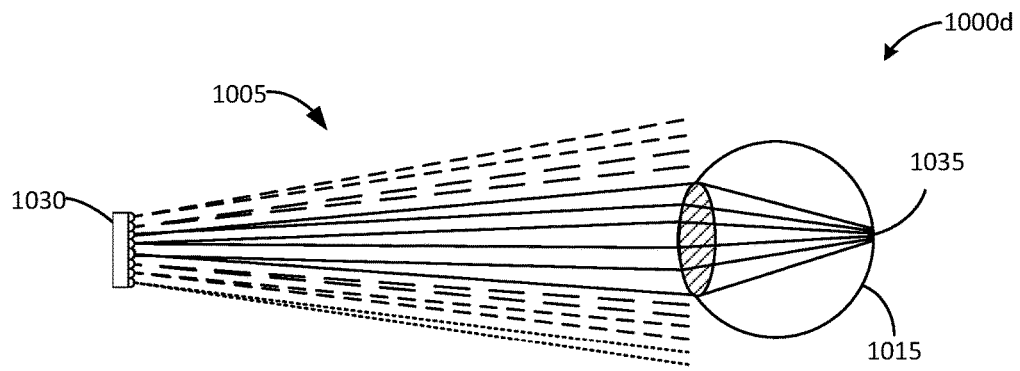

As depicted in diagram 1000d of FIG. 10D, if the sources 1030 are emitting into different directions, as the illumination device described herein may be, some of the light at a given distance will miss the retina 1015 and not be a hazard. The light that is collected will be from beams emitting in a similar direction. If those sources 1030 are close together, they can contribute to a total exposure on a small area of the retina 1035. Our calculations have shown that we could exceed the safety limits on one of our devices by have three adjacent zones on at the same time when the viewer is close enough for all three zones to be imaged on the retina 1015.

Figure 10E:
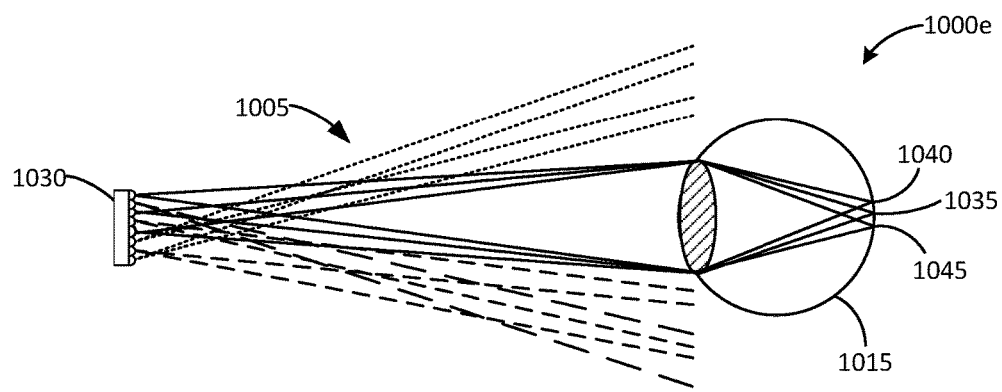

As depicted in diagram 1000e of FIG. 10E, by switching around the positions of the laser arrays on the die, so that adjacent sources 1030 do not emit in the same direction, we can create a situation in which the zones that are emitted in the direction of the eye 1010 and collected by the eye 1010 are not imaged close together on the retina 1015, reducing the hazard and allowing a higher power output by the lasers. In one example, the separation between the sources 1030 emitting in similar directions needs to be 0.5 mm when the eye 1010 is at the minimum viewing distance of 100 mm. Then the images 1035, 1040, 1045 of the sources 1030 on the retina 1015 are far enough apart to be considered separate. The minimum viewing distance is the closest distance that an observer can still focus the source on their retina 1015.

Figure 10F:
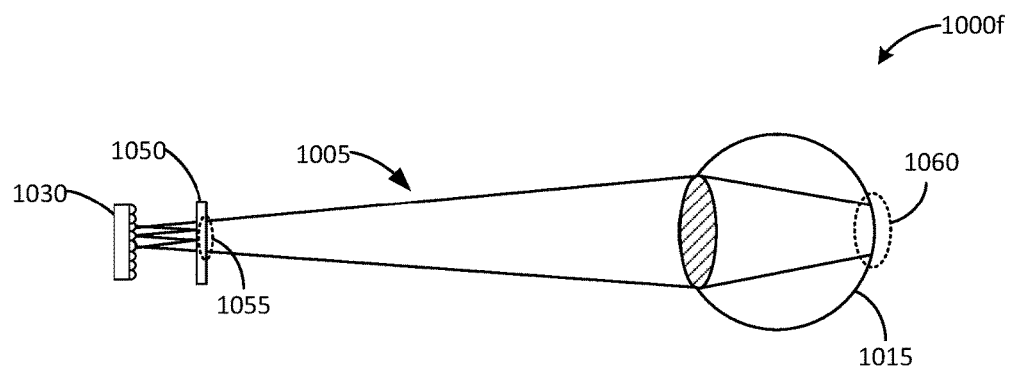

As depicted in diagram 1000f of FIG. 10F, in all these cases, adding a diffuser 1050 in front of the beams increases the apparent size of the source 1030. The scattering by the diffuser 1050 causes the illuminated spot 1055 on the diffuser surface 1060 to be the source that will be imaged on the retina 1015. Since that is bigger by the size of the beam on the diffuser 1050, the spot 1060 on the retina is larger, decreasing the intensity.

Figure 11A:
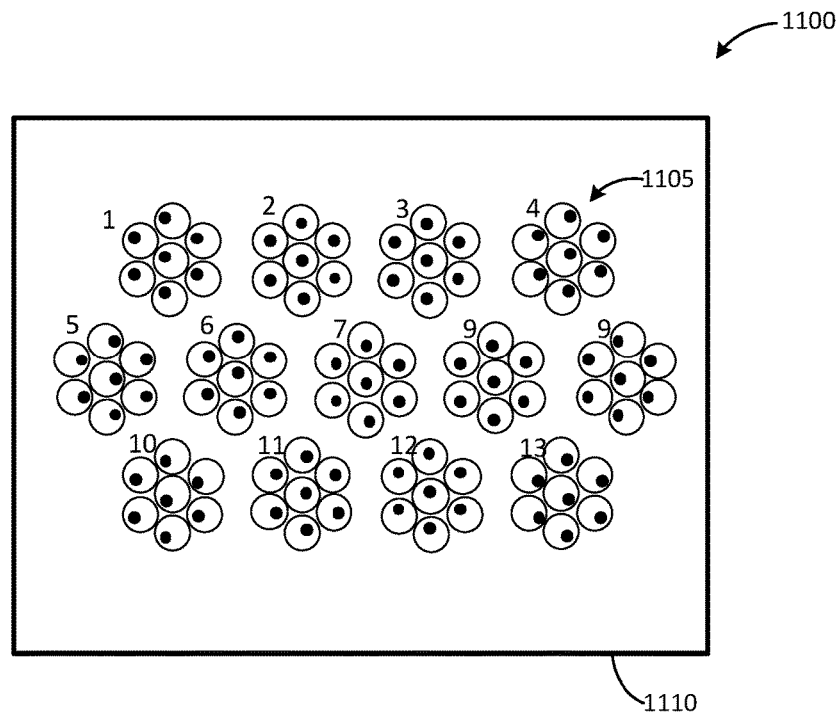
FIGS. 11A and 11B illustrate another group of 13 sub arrays, with each sub array having a certain radial offset, rearranged for better eye safety and the corresponding illumination pattern provided by the group of sub arrays.
Figure 11B:
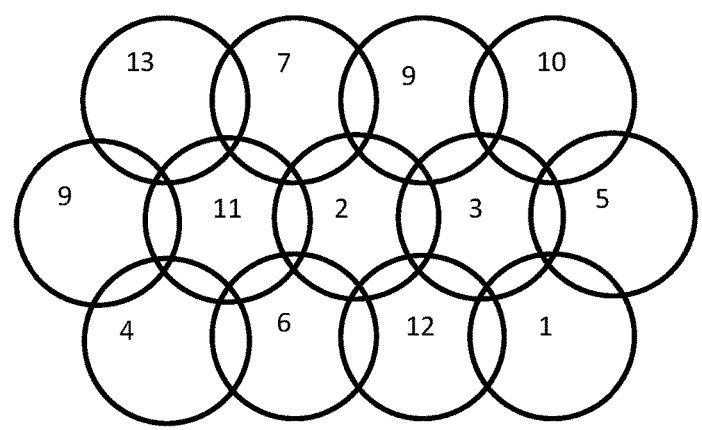

FIG. 11A depicts a version of the 13-zone illuminator 1100 in which the array locations 1105 are switched so that adjacent laser arrays are not directing their beams in similar angles. This and similar configurations of the laser arrays 1105 may be used to maintain or increase eye safety of the entire laser array while operating at higher power/intensity levels. This is done by simply rearranging the offsets of the micro-lenses 1110 to the laser axes as shown. This rearrangement of the laser arrays 1105 and micro-lenses will work with the same submount 705 as shown in FIG. 7, except that the bond pad locations for the different beam locations in the detector field of view will be switched to correspond to the new array locations. The correspondence of the array locations to the beam positions 1115/illumination pattern is depicted in FIG. 11B.

Figure 12:
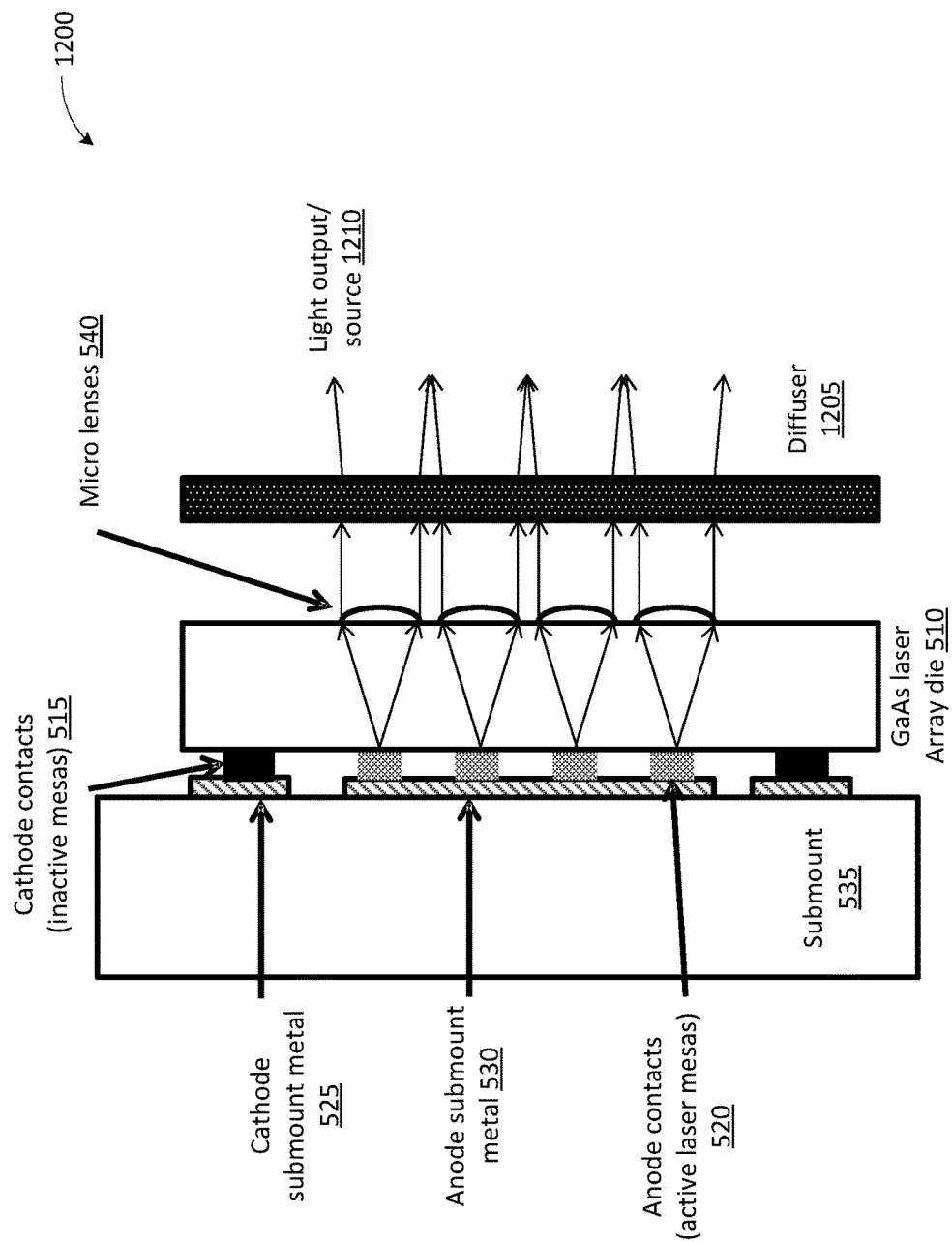
FIG. 12 is a diagram of an example VCSEL array device in combination with a diffuser.

Further eye safety improvements can be made for higher power operation for longer ranges by adding a diffuser 1005 in front of the illuminator/laser 1200 as shown in FIG. 12. The diffuser 1205 also makes the apparent size of the source 1210 larger by the amount the beam has expanded at the location where it intersects the diffuser. Holographic diffusers have the property that they can be used to add a limited amount of increased divergence to the beams without changing the beam direction, so that the capability of the illuminator 1200 to address different regions within the detector field of view is not diminished.

The techniques described in U.S. Pat. No. 9,232,592B2 may be combined with the multi-zone illuminator described herein. The individual zones of the illuminator may be controlled electronically (e.g., by the image processor 305 and laser drive electronics 330 illustrated in FIG. 3) so that the exposure duration of the subject from each zone of the illuminator is limited to keep the exposure below the eye safety limits at all times. By switching the drive current from one subarray or illumination device (e.g., laser or VCSEL array) to the other in sequence, the total exposure to the observer's eye can be limited. The fact that the illumination zones will be imaged on different locations on the observer's retina is an added factor in increasing the exposure tolerance of the eye to the illumination level.

There may be limits to the size of angular field that the illuminator can cover using only the integrated micro-optical elements. If the micro-optical elements are micro-lenses 540, they will have losses from internal reflections and beam profile distortions from off-axis aberration as the deflection angles increase. Similarly, diffractive elements will have higher diffraction losses and become more difficult to fabricate at large deflection angles. In order to increase the field coverage of an illuminator 1200, an external optic can be added in addition to the integrated micro-lenses 540.

Figure 13:
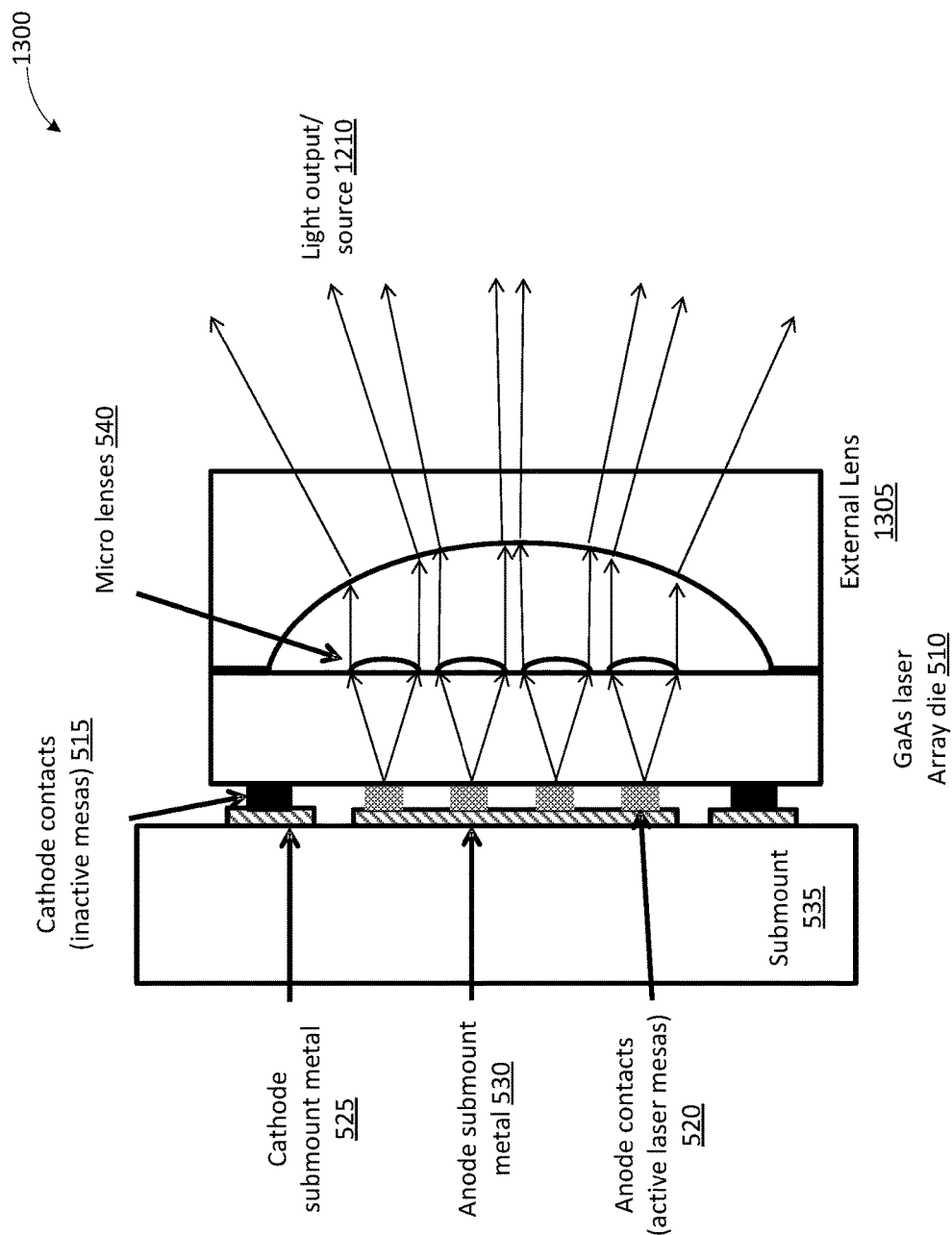
FIG. 13 is a diagram of an example VCSEL array device in combination with an external optic.

An external optic 1305, which may be a larger aperture device that can change the beam direction and divergence properties for all of the beams at once, may be placed after the micro-lenses 540, as illustrated in the illuminator 1300 of FIG. 13. A negative power optic, which is an example of external optic 1305, as depicted, can increase the divergence of the beams and increase their off-axis angular direction to cover a larger field of view. A special case of this external optic 1305 has a toroidal optical surface with two different radii of curvature for the vertical and horizontal axes. This external optic allows for different increases (or decreases) of the beam angle and divergence separately in the vertical and horizontal directions. The external optic can also be another micro-lens array, in which a second substrate with an array of micro-lenses with additional offsets can be used to increase the deflection angle of the beams (not shown).

Figure 14:
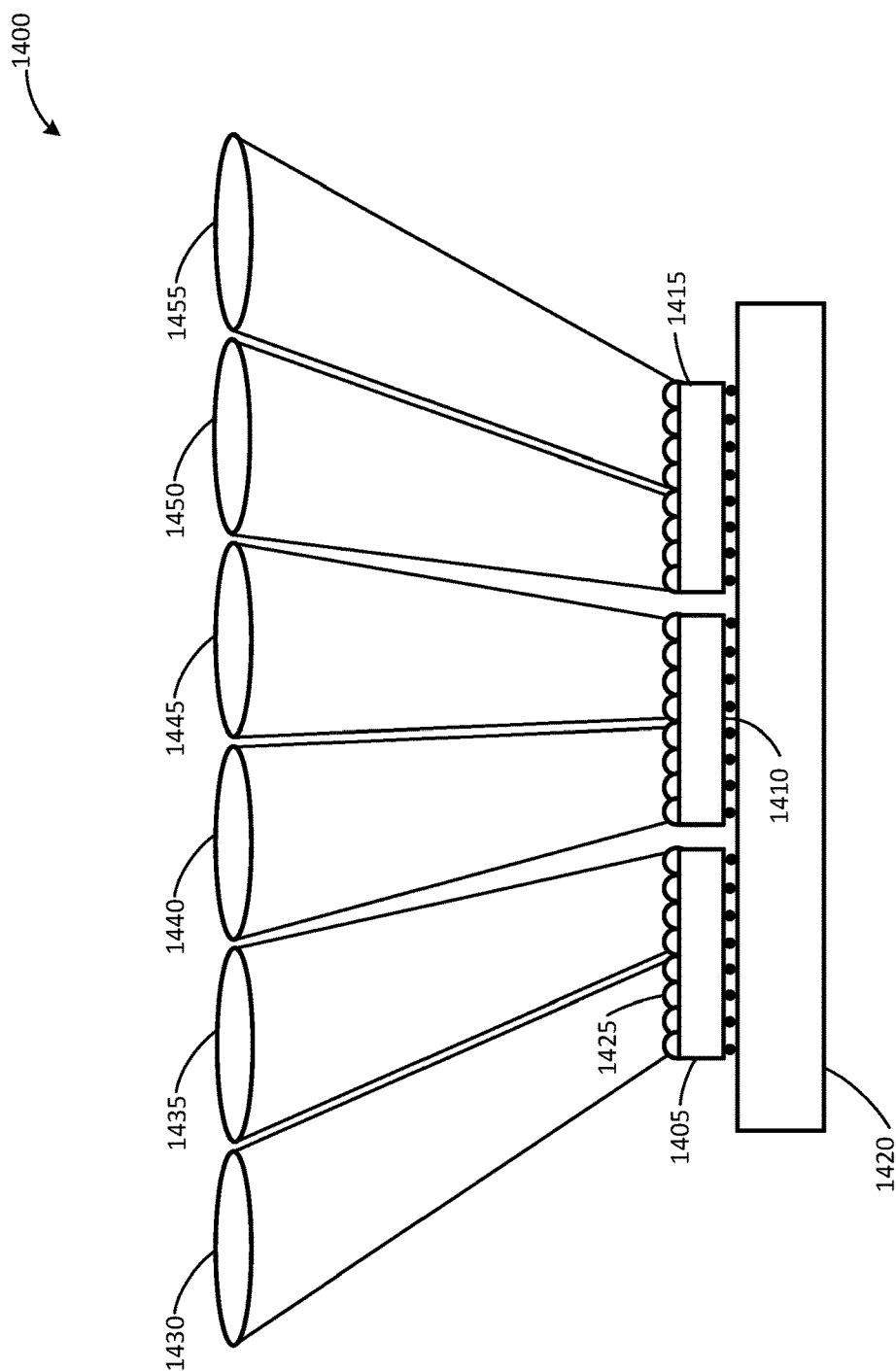
FIG. 14 is a cross-sectional view of the VCSEL array device of FIG. 11, with a corresponding illumination pattern.

For situations where higher power from larger laser arrays are required, for longer distance illumination or for illuminating very large fields of view, a multiple substrate approach may be required. FIG. 14 depicts an example multi substrate array 1400. Fabricating larger laser arrays for each beam on a single laser die may be impractical due to cost and yield issues. In an alternative embodiment, multiple laser die 1405, 1410, 1415 are flip-chip bonded to a common submount 1420 that enables separate electrical contact to multiple laser arrays on each die. The laser die have micro-optical elements 1425 as described previously, but they can be different for the individual laser die, so that fewer, but larger laser arrays are fabricated on each die. Each die will then form some of the beams 1430, 1435, 1440, 1445, 1450, 1455 to cover the detector field of view. The combination of beams 1430, 1435, 1440, 1445, 1450, 1455 from all the laser die can then cover the complete detector field of view. With larger numbers of laser emitters available for each beam, substantially higher powers can be provided for each beam. Each of the die 1405, 1410, 1415 may have an external optical element, such as a lens or diffuser added as described earlier. A single optical element may be added with an aperture large enough for all the die 1405, 1410, 1415 to transmit light through for additional beam forming, matching the detector field of view or for improved eye safety, for example.

While the present disclosure has been illustrated and described herein in terms of several alternatives, it is to be understood that the techniques described herein can have a multitude of additional uses and applications. Accordingly, the disclosure should not be limited to just the particular description, embodiments and various drawing figures contained in this specification that merely illustrate one or more embodiments, alternatives and application of the principles of the disclosure.

What is claimed:

1. An infrared illumination system, comprising:
a plurality of infrared illumination sources including a first infrared illumination source and a second infrared illumination source, the first infrared illumination source configured to provide illumination to a first zone of a plurality of zones, the second infrared illumination source configured to provide illumination to a second zone of a plurality of zones, the first zone being different than the second zone, and each of the plurality of zones corresponding to at least part of an angular portion of a field of view of an image sensor, wherein the plurality of infrared illumination sources comprise one or more arrays of a plurality of vertical-cavity surface-emitting lasers (VCSELs);
plurality of microlenses, each microlens among the plurality of microlenses corresponding to each VCSEL among the plurality of VCSELs, wherein each microlens directs illumination from a corresponding VCSEL to at least one of the plurality of separate zones; and
an image processor in communication with the plurality of infrared illumination sources and the image sensor, and configured to define an area of interest in the field of view of the image sensor and separately control each of the plurality of infrared illumination sources to provide an adjustable illumination power to at least one of the plurality of separate zones and alter an illumination of the area of interest, in response to image data indicative of an illumination of one or more areas in the field of view of the image sensor.

2. The system of claim 1, wherein the image processor is configured to:
receive image data from the image sensor; and
adjust the illumination power of at least one of the plurality of infrared illumination sources to avoid saturation of the image sensor or maximize illumination to areas of the field of view having low reflectivity.

3. The system of claim 1, wherein separately controlling each of the plurality of infrared illumination sources to provide an adjustable illumination power to at least one of the plurality of separate zones by the image processor comprises turning on or off at least one infrared illumination source.

4. The system of claim 1, wherein the image processor is configured to turn on or off a number of the plurality of infrared illumination sources sequentially or based on a timing pattern.

5. The system of claim 1, further comprising:
an electronic driver circuit in communication with the image processor and configured to adjust a current supplied to at least one of the plurality of infrared illumination sources to adjust the illumination power provided by the at least one of the plurality of infrared illumination sources.

6. The system of claim 1, wherein each VCSEL or subsets of the plurality of VCSELs have independent electrical connections to the image processor or an electronic driver circuit.

7. The system of claim 6, wherein each microlens defines a separate field of illumination for each VCSEL.

8. The system of claim 1, wherein the image processor is further configured to:
identify an object or area of interest based on image data received from the image sensor; and
turn at least one of the plurality of illumination sources off or on to provide a select illumination power to or around the identified object or area of interest.

9. The system of claim 8, wherein the system further comprises the image sensor, and wherein the image sensor or the image processor is configured to track the object or area of interest.

10. A laser array, comprising:
a plurality of vertical cavity surface emitting lasers (VCSELs) attached to a common submount, wherein individual or groups of the plurality of VCSELs are independently electrically connectable to external driver circuitry; and
a plurality of micro-optical devices aligned with apertures of the individual or the groups of the plurality of VCSELs, wherein the individual or the groups of the plurality of VCSELs are configured to be individually activated through the independent electrical connection to provide adjustable illumination to different zones of the field of view of an image sensor defined by the plurality of micro-optical devices, wherein each of the different zones corresponds to at least part of an angular portion of the field of view;
wherein a first individual or group of the plurality of VCSELs are configured to illuminate a first zone among the different zones, a second individual or group of the plurality of VCSELs are configured to illuminate a second zone among the different zones; and
wherein the illumination of at least one of the different zones of the field of view alters an illumination of an area of interest in the field of view of the image sensor, and the illumination is adjusted in response to image data indicative of an illumination of one or more areas in the field of view.

11. The laser array of claim 10, wherein the plurality of micro-optical devices comprises at least one of a micro-lens or a diffractive optic.

12. The laser array of claim 10, wherein the plurality of micro-optical devices are fabricated into a substrate of the plurality of VCSELs, wherein the plurality of VCSELs and plurality of micro-optical devices form a monolithic array.

13. The laser array of claim 10, wherein the plurality of micro-optical devices are fabricated in a separate transparent substrate.

14. The laser array of claim 10, wherein the plurality of micro-optical devices comprise a plurality of micro-lens elements, and wherein at least one micro-lens element is offset from an aperture of a first individual VCSEL or the apertures of a first subset of VCSELs among the plurality of VCSELs, wherein the offset in part defines a distinct zone or angular spread of the first individual VCSEL or the first subset of VCSELs.

15. The laser array of claim 10, wherein the plurality of VCSELs are divided into groups, and wherein adjacent groups of VCSELS do not form adjacent illumination patterns to enhance eye safety of the laser array.

16. The laser array of claim 10, wherein the plurality of VCSELs are divided into groups, and wherein the groups comprise different numbers of VCSELs to compensate for inefficient transmission from other groups with large micro-optical element offsets for illumination of at least one zone of the different zones that has a larger deviation angle from the different zones.

17. The laser array of claim 10, further comprising an external optic element aligned to the plurality of VCSELs, wherein the external optic element increases an angular separation of each of the different zones.

18. The laser array of claim 10, further comprising an external optic element aligned to the plurality of VCSELs, wherein the external optic element comprises a toroidal optical surface enabling independent adjustment of a vertical and a horizontal angular separation of the different zones.

19. The laser array of claim 10, further comprising an external diffuser aligned to the plurality of VCSELs, wherein the external diffuser increases an apparent size of the VCSELs to provide higher illumination powers within eye safety requirements.

20. A method of infrared illumination, comprising:
receiving illumination information specifying a field of view of a camera and an area of interest in the field of view;
controlling a first sub array or individual illuminator of an illuminating array to output light at independently adjustable illumination powers in a first zone of a plurality of separate zones corresponding to the area of interest in the field of view of the camera based on the received illumination information for one or more areas in the field of view of the camera; and controlling a second sub array or individual illuminator of the illuminating array to output light at independently adjustable illumination powers in a second zone of the plurality of separate zones corresponding to the area of interest in the field of view of the camera based on the received illumination information for one or more areas in the field of view of the camera;

two or more micro-optical devices aligned with apertures of each of the first sub array individual illuminator and the second sub array or individual illuminator, wherein the first zone is different than the second zone, wherein each of the first zone and the second zone correspond to at least part of an angular portion of the field of view, and wherein the two or more micro-optical devices direct illumination from a corresponding sub array or individual illuminator to either the first zone or the second zone.

21. The method of claim 20, wherein the two or more micro-optical devices are an offset or a micro-lens, further comprising:

configuring at least one of the offset or the micro-lens of at least one of the first sub array or individual illuminator and the second sub array or individual illuminator to define a first illumination pattern of the illuminating array.

22. The method of claim 21, wherein the configuring the at least one of the offset or the micro-lens further comprises:

configuring at least one of the offset or the micro-lens of the first sub array or individual illuminator and the second sub array or individual illuminator to provide a dispersed illumination pattern.

23. The method of claim 21, further comprising:

turning the first sub array or individual illuminator or the second sub array or individual illuminator on or off to provide the first illumination pattern.

24. The method of claim 20, further comprising:

identifying an object or area of interest based on image data received from an image sensor; and turning at least one of the first sub array or individual illuminator and the second sub array or individual illuminator off or on to track the identified object or area of interest.

* * * * *